United States Patent [19]

Balzer

[11] Patent Number: 5,327,437
[45] Date of Patent: Jul. 5, 1994

[54] METHOD FOR TESTING ELECTRONIC ASSEMBLIES IN THE PRESENCE OF NOISE

[75] Inventor: Raymond J. Balzer, Boulder, Colo.

[73] Assignee: Hewlett-Packard Company, Palo Alto, Calif.

[21] Appl. No.: 797,616

[22] Filed: Nov. 25, 1991

[51] Int. Cl.⁵ .............................................. G01R 17/00
[52] U.S. Cl. .................................... 371/25.1; 364/554
[58] Field of Search ............... 371/25.1; 364/580, 554, 364/575

[56] References Cited

U.S. PATENT DOCUMENTS 4,782,456 11/1988 Poussier et al. ..................... 364/574
5,130,936 7/1992 Sheppard ......................... 364/551.01

Primary Examiner—Stephen M. Baker

[57] ABSTRACT

An iterative test method which is operable in the presence of measurement noise uses the result of a particular measurement on a device to decide whether to pass or fail the device or to take another measurement. The pass/fail decision is made by computing certain statistical values which "compare" the measurement result to a predefined pass/fail limit. Another test measurement is made if the result of the present measurement is too "close" to the pass/fail limit to make an accurate decision. If the result is not too "close" to the limit then a pass/fail decision is made based on whether the measurement is on the pass or fail side of the limit. The statistical values used to compare the measurement value to the limit can be Z-statistics or Student-t statistics depending on the test environment and the noise characteristics. Overall feedback can be added to dynamically adjust the statistical values in order to bring overall error rates into alignment with predetermined error rate targets.

38 Claims, 17 Drawing Sheets

METHOD FOR TESTING ELECTRONIC ASSEMBLIES IN THE PRESENCE OF NOISE

FIELD OF THE INVENTION

The present invention relates, in general, to statistical evaluation and control of tests on electronic assemblies and, in particular, to production testing of electronic assemblies in which a number of measurements, each subject to noise, are performed on each test unit and averaged, with the number of measurements being determined by statistical criteria.

BACKGROUND OF THE INVENTION

In order to assure good quality control, many present day electronic assemblies are tested at one or more stages during the manufacturing process. Such measurements are generally conducted by measuring one or more electrical parameters of the electronic assembly by means of automated testing machines.

Such parametric measurements are usually associated with some amount of electrical "noise" due to contact resistance in the test probes, temperature variations, component variations and other factors. For each parameter, the noise manifests itself by causing repetitive measurements of the parameter to yield different results even if the same device is used for all of the tests.

The spread in the resulting values often results in difficulty and errors in determining whether a particular measured value of a parameter falls within predetermined acceptable ranges. For example, an actual parameter value may fall outside of the acceptable range, but, due to noise, the measured value of that parameter may be inside the acceptable range, thereby causing the tested device to be erroneously accepted. Alternatively, an actual parameter value may fall within the acceptable range, but, due to noise the measured value of that parameter may be outside of the acceptable range, thereby causing the tested device to be erroneously rejected.

Consequently, when noise is a problem, it is common practice to take a number of measurements of a particular parameter, average the results and compare the average to the acceptable range. However, if, as is often the case, the average is close to the acceptance or rejection limits, the number of measurements used to generate the average may be increased in order to insure that predetermined quality control limits are met. A great amount of time can be consumed by multiple measurements. As a result the test portion of the manufacturing process can seriously reduce the overall throughput of the process. In addition, the decision to increase or decrease the number of measurements used to generate the average or to accept or reject units with averages near the limits may be left to operator discretion causing unpredictable results.

An additional problem may arise because the "true" value of the measurement is not known due to the noise. Consequently, prior art methods have been developed to estimate a true parameter value from multiple measurements taken of that parameter.

One of the aforementioned prior art methods is simple averaging in which the results of a predetermined number of measurements of the test parameter are averaged to generate an estimate of the true parameter value. During subsequent testing, a fixed number of measurements is performed on a new device, the measurement values are averaged, the average value is compared to the pass/fail limit and a decision is made to accept or reject the device. The primary assumption with the averaging method is that the average of a large number of equally-weighted measurement values is an accurate approximation of the true test parameter value. The method is only efficient where parameter values are very tightly grouped near the pass/fail limit compared to the width of the measurement error; otherwise many more measurements are taken than are required to establish a good estimate of the measurement value. Unfortunately, in most parameter measurement situations, the parameter values do not meet the latter criteria and many more measurements are made than are necessary in most cases, consequently, the simple averaging method is inefficient and results in relatively high test costs to insure a predetermined accuracy.

Other prior art statistical methods have been developed which can be used to estimate the number of repetitive measurements that must be taken in order to insure, with a predetermined probability, that a particular quality control level is reached. A prior art method which can estimate the number of repetitive measurements that must be taken is called the "Bayes" method and is described in more detail in an article entitled "A Bayesian Approach to Improving Test Effectiveness and Evaluating Test Strategy", G. Larsen and R. M. Mahoney, *Proceedings of the ATE West Conference,* Anaheim, Calif. (January 1990). The Bayes method has significant advantages over simple averaging because it needs only pass/fail decision from each test. Consequently, in many cases, it is the only statistical method which can be used where only pass/fail information is available (such as certain pass/fail medical diagnostic tests).

As described in the aforementioned article, the Bayes method is an iterative process. Certain inputs relating to the measurement process must be known from either a theoretical analysis of the measurement process or from production history and these values are used to compute a statistical pass/fail limit number. During a subsequent actual measurement sequence, a measured value is used compute a new statistical number and this latter number is compared to the previously computed limit number to determine whether the particular device under test (DUT) passes or fails or whether another measurement should be taken. Repetitive measurements are taken until "resolution" is achieved: the DUT either passes or fails.

One problem with the Bayes method is that it requires three particular inputs: expected failure rate, false alarm rate, and missed fault rate in order to compute the required statistical numbers. If there has been a significant production history for a testable parameter and the production processes are stable, the expected failure rate can be easily calculated by well-known statistical methods (although for tests conducted at very "basic" levels, such as in-circuit tests conducted component-by-component, the actual measurement variations may far exceed that predicted by statistical computations).

The false alarm rate and the missed fault rate are typically not well-known even after significant production experience. In addition, the performance predicted by the Bayes method is only achievable if the aforementioned rates are specifically known for each particular device and parameter being tested, for example, for a particular voltage reading on a given unit. When just a historical average rate across multiple DUTs is used, the performance is drastically lower than that predicted. Since the historical average is generally the only parameter that is available, the Bayes algorithm is not as efficient as predicted.

Consequently, it is an object of the present invention to provide a statistical testing method which efficiently evaluates parameter measurements which are subject to noise.

It is another object of the present invention to provide a statistical testing method in which preset target error rates can be attained with fewer average test iterations than prior art methods.

It is still another object of the present invention to provide a statistical testing method that provides explicit control over target error rates.

It is still another object of the present invention to provide a statistical testing method which provides control over the maximum test iterations.

It is yet another object of the present invention to provide a statistical testing method which can be used with both a single pass/fail limit and dual pass/fail limits.

It is a further object of the present invention to provide a statistical testing method in which a special "marginal" category can be defined which can be used to categorize certain DUTs and improve overall performance of the testing method.

It is yet a further object of the present invention to provide a statistical testing method in which the statistical test which is used to control test procedure can be selected to optimize performance of the method on both production testing and tests performed on a single DUT.

SUMMARY OF THE INVENTION

The foregoing problems are solved and the foregoing objects are achieved in one illustrative embodiment of the invention in which an iterative test method uses the result of a particular measurement on a device to decide whether to pass or fail the device or to take another measurement. The pass/fail decision in a single pass/fail limit situation is made by computing certain statistical values which "compare" the measurement result to a predefined pass/fail limit. Another test measurement is made if the result of the present measurement is too "close" to the pass/fail limit to make an accurate decision. If the result is not too "close" to the limit then a pass/fail decision is made based on whether the measurement is on the pass or fail side of the limit.

In particular, for most noise characteristics, a known statistical test using "Z-values" is used to make the decision as to whether the measurement result is "close" enough to the limit as to warrant another measurement. In order to use this test, a pass/fail Z-value limit is computed in advance of the actual test run in a conventional manner using user-specified confidence values and standard normal distribution numbers. In addition, the standard deviation of the measurement error is calculated in advance by taking repeated measurements on a single DUT and using standard statistical formulas to calculate an estimate of the required standard deviation.

During actual device testing, a measurement average is determined by calculating the running average of previous and present values. A new Z-value for the present measurement is then calculated using the calculated average, the predefined pass/fail limit, the estimated standard deviation and the total number of measurements. The new Z-value is then compared to the previously-calculated Z-value limits to make a decision whether to resolve the device status or make another measurement. This decision is re-evaluated after each measurement.

The same testing method is directly extendable to dual pass/fail limit cases in which two Z-values are calculated to make a decision whether to resolve the device status or make another measurement.

DETAILED DESCRIPTION OF THE PREFERRED EMBODIMENT

Figure 1:
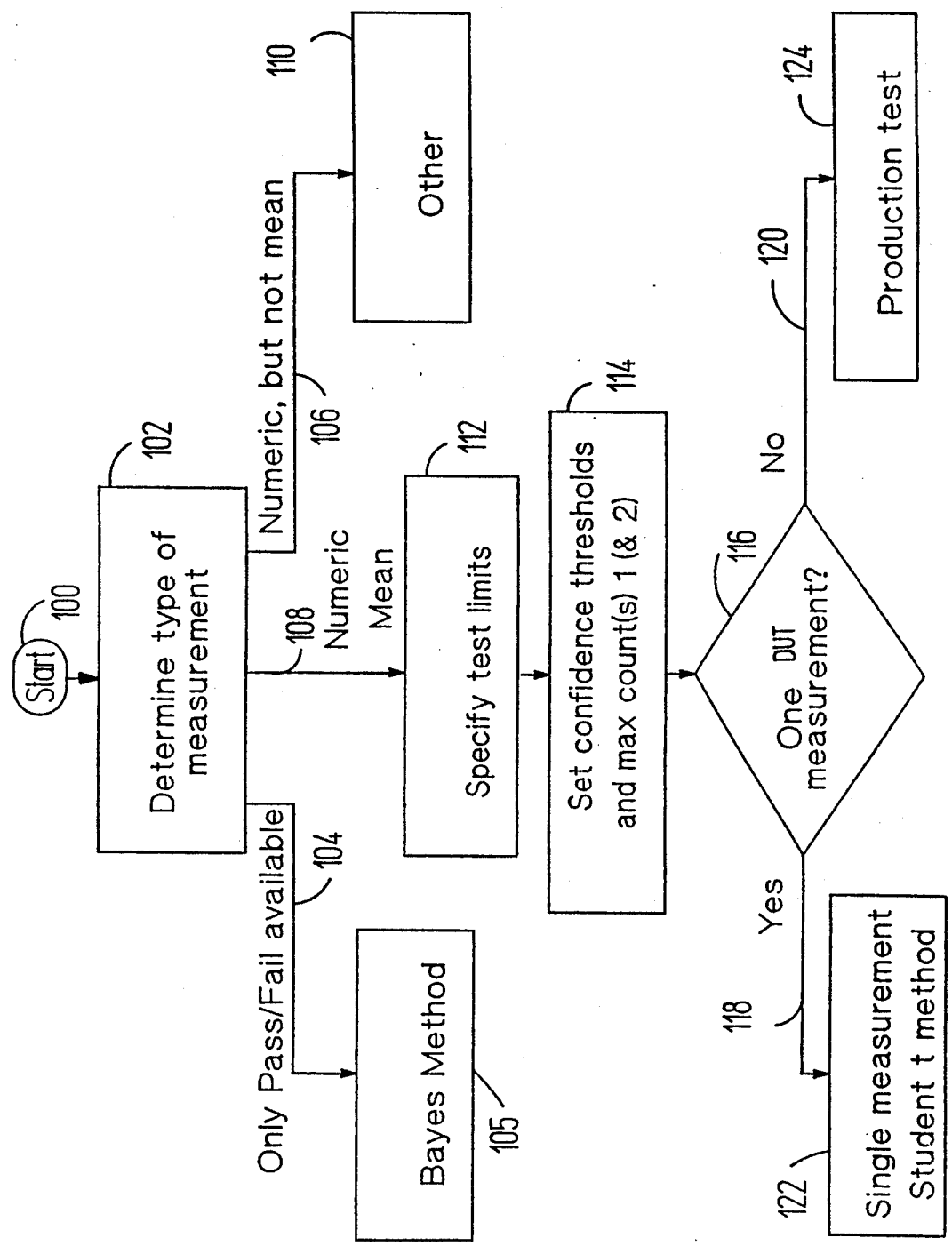
FIG. 1 is an illustrative schematic diagram of preliminary steps in the inventive method in which a test method is selected depending on the type and distribution of the noise present in the measurements.

As previously mentioned, for measurement values in which the average represents the true value and in which the standard deviation is constant from unit to unit, a known statistical test using "Z-values" is used to make the decision as to whether the measurement result is close enough to the limit as to warrant another measurement. Although the use of the Z-statistics is preferred, for measurements where the standard deviation is not constant from unit to unit, but the noise is normally distributed and the average represents the true value, other statistical tests such as the Student-t test can be used in place of the Z-test.

In the description of the overall method which follows a single pass/fail limit case is assumed. Later, an example using a dual pass/fail limit is described in more detail. In the single limit case, a pass/fail Z-value limit is computed in advance of the actual test run in a conventional manner. During actual device testing, a new Z-value for the measurement is then calculated using the measurement values and the new calculated Z-value is then compared to the previously calculated pass/fail Z-value limit to make a decision whether to resolve the device status or make another measurement.

The statistical basis for the illustrative method is a conventional statistical test known as a "null hypothesis" statistical test which is a common technique to apply statistical calculations to a known statistical population. In using such a test a hypothesis is constructed about a particular characteristic of the population. Statistically relevant values are calculated assuming the hypothesis is true and using selected parameters of the population and these relevant values are compared to a table to determine if the hypothesis results are statistically significant and the hypothesis should be accepted or whether the result is not significant and the hypothesis should be rejected.

In the illustrated inventive method, the "null" hypothesis which is tested can be stated as follows:

The DUT measurement comes from a measurement population whose mean is centered exactly at the pass/fail limit.

If as described below, this null hypothesis is rejected in accordance with statistical calculations, then the DUT is passed or failed accordingly depending on the value of the measurements. Otherwise, an additional measurement is taken.

In order to evaluate the hypothesis, the inventive method requires that certain characteristics of the standard deviation of the DUT measurement error be known. Different statistical tests are used depending on whether the standard deviation is constant or varies—Z-statistics are used if the standard deviation is constant from DUT to DUT whereas Student-t statistics can be used for non-constant standard deviations.

Assuming that the standard deviation is constant from DUT to DUT so that Z-statistics can be used, an estimate (S) can be made of the standard deviation by taking a number of measurements on a single DUT and computing the estimate using a standard statistical formula such as the following formula:

$$S = SQR \frac{n \cdot \sum_{i=1}^{n} Xi^2 - \left(\sum_{i=1}^{n} Xi\right)^2}{n \cdot (n-1)} \quad (1)$$

where n is the number of measurements made on the DUT, Xi is the value of each measurement and the expression SQR indicates that the square root should be taken of the expression in the parentheses.

Once the estimated standard deviation is known, the Z-test can be used to determine whether the aforementioned null hypothesis should be accepted or rejected. More specifically, in cases where a single pass/fail limit is used, before actual testing of DUTs is started, a single-sided Z-value pass/fail limit is calculated based upon a user-specified confidence level. This computed pass/fail Z-value limit corresponds to the number of standard deviations of a single-sided normal distribution required to achieve the specified confidence level. Illustratively, the Z-value pass/fail limit can be calculated by determining the area under the normal curve by means of numerical integration or a straightforward algebraic approximation routine.

The pass/fail Z-value limit calculated as set forth above can remain constant throughout the entire body of tests, but, as explained in detail below, according to the inventive method the initial pass/fail Z-value limit can also be dynamically modified during testing in order to cause the measurement error rates to approach user-specified target rates.

Actual measuring of DUTs is then started. After each measurement, the average value of all measurement values including past measurement values and the present measurement value is computed. This is done by summing the present value with the sum of all past values and dividing the resulting sum by the current measurement count. With this new computed average value, the estimated standard deviation (S) and a predefined parametric pass/fail limit (specified by the user), the Z-value of the current DUT measurement can be calculated using the following equation:

$$Z = \frac{ABS \text{ (Average } - \text{ Limit)}}{S/SQR(\text{Number of Measurements})} \quad (2)$$

where the expression ABS indicates the absolute value of the expression in parentheses.

The Z-value for the current measurement is then compared to the previously-calculated pass/fail Z-value limits (as initially calculated or later modified). If the current measurement Z-value exceeds the precalculated pass/fail Z-value limit, then the null hypothesis is rejected and the DUT is passed or failed depending if the measurement average is on the "pass" or the "fail" side the predefined pass/fail limit. Alternatively, if the current measurement Z-value is less than the precalculated pass/fail Z-value limit, the null hypothesis is accepted and, an additional measurement is taken and the aforementioned sequence is repeated. Measurements and calculations are repeated until the status of the unit is "resolved" (either passed or failed) or the measurement count equals a predetermined maximum limit. At this point, the user can select an alternative action: pass all maximum count DUT's, fail all maximum count DUT's, pass or fail DUT's according to their current average, or declare maximum count DUT's as "marginal."

The method can also be used for dual limit measurements (which establish, for example, "pass" and "fail" ranges). In this case two Z-values are calculated for each measurement—one for each pass/fail limit value. The method steps for dual limit operation are described in detail below.

The inventive method is suitable for use in an environment in which a measurement on a particular device parameter can be quickly and easily repeated. Such an environment may consist, for example, of a production test station on a manufacturing line. In a typical modern test station, the actual test facility may be computer controlled and measurements are made automatically on each DUT. The aforementioned statistical Z-test can be used if the parameter statistics meet certain criteria (as discussed below). Alternatively, for production environments in which the noise statistics do not meet the criteria for use of the Z-test or test environments in which measurements are to be conducted on a single DUT (for example, an odd part) the aforementioned Z-test may not be appropriate. In these cases, the inventive method can operate with other statistical tests.

FIGS. 1-17 show in detail the steps in an illustrative routine using the inventive method which might be used in an automatic test station and which can handle many test situations. Of course, these steps would be programmed into the controlling computer in a conventional fashion. The actual programming would depend on the type of test station used in the testing sequence. An illustrative computerized test station may be an HP3070 automated circuit board tester manufactured by the Manufacturing Test Division of Hewlett Packard Corporation, P.O. Box 301A, Loveland, Colo. 80339. This unit can be programmed to perform multiple tests on a single DUT and to automatically change and set up multiple DUTs.

Referring to FIG. 1, in order to use the inventive method, it is necessary to first make a decision about the type of measurement noise present and its distribution in order to determine whether the inventive test method is appropriate for use in a particular situation and the type of statistics (Z-statistics or Student-t statistics) which should be used. In particular, the illustrative routine starts at step 100 and proceeds to step 102. In step 102, a determination is made of the characteristics of the available measurement population for the DUTs. If only pass/fail information is available, the routine proceeds, via path 104, to step 105 in which the aforementioned Bayes method is used since this is the only practical iterative method that can be used when only pass/fail data is available.

Alternatively, if actual numeric test data is available from each test, a further check must be made to determine whether the numeric mean of measured values of a particular parameter over multiple measurements of the same parameter represents the true value of the parameter. If the measurement average does not represent the true value, then neither Z-statistics nor Student-t statistics can be used and the routine proceeds, via path 106, to step 110 in which other methods must be used to control testing. These other methods may, for example, be data specific for the particular measurement population.

Alternatively, if in step 102, numeric measurements are available in which the numeric mean of multiple measurements represents the true value of the measurement, then the inventive method is applicable and the routine proceeds, via path 108, to step 112.

In step 112, test limits are specified. Illustratively, for each parameter, an acceptable range can be established by entering a High Limit and a Low Limit for that parameter. These limits are stored for later use in the testing sequence.

The routine then proceeds to step 114 in which the confidence threshold targets and the maximum counts predetermined by the user are entered into the routine. As previously mentioned, the confidence threshold targets are the desired confidence levels used by the method to calculate certain parameters for making a pass or a fail decision. For example, the user can specify that he desires a 99.99% confidence threshold in passing or failing a particular DUT. As will be discussed, the operation of the routine insures that the confidence targets will be met or exceeded for DUTs which do not reach the maximum count limit. In accordance with the inventive method there can be a separate confidence targets for a pass decision and for a fail decision.

Figure 2:
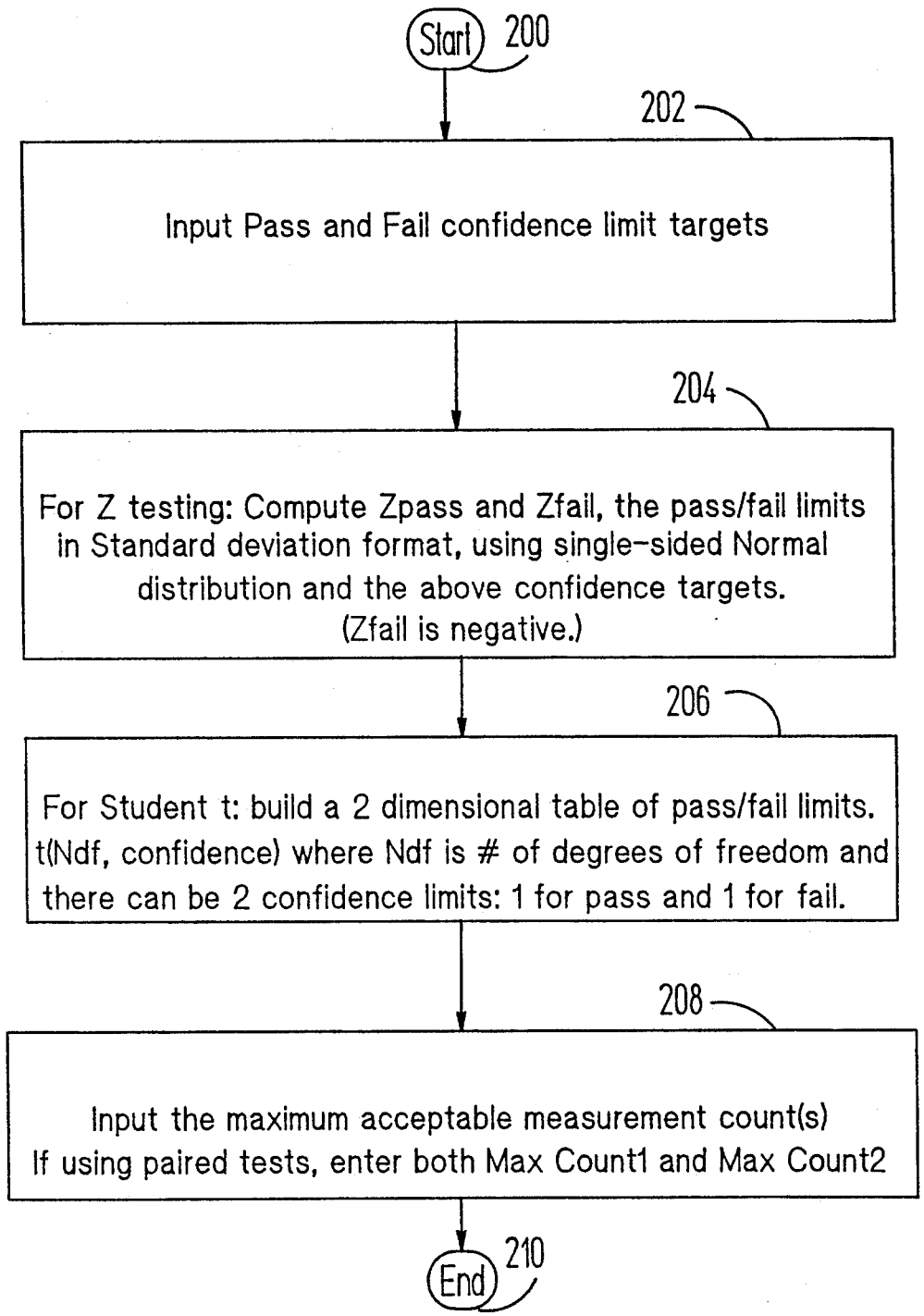
FIG. 2 illustrates an expansion of step 114 in FIG. 1 indicating the steps used to set the confidence threshold and maximum count value.
Figure 3:
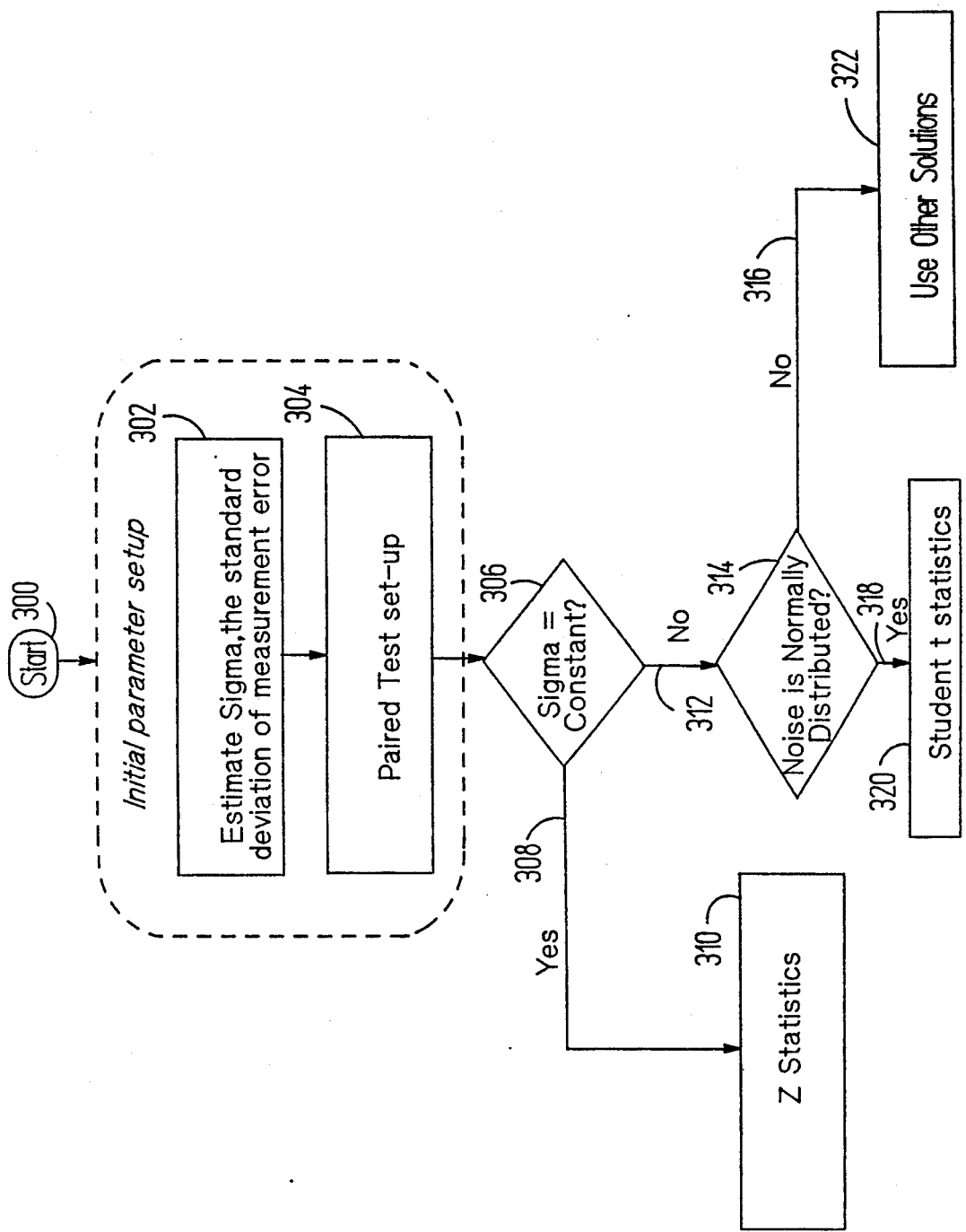
FIG. 3 is an illustrative schematic diagram of the steps in the production test step (124) shown in FIG. 1.

The sub-steps carried out to perform step 114 are shown in more detail in FIG. 2. In particular, the steps followed to set the confidence targets and maximum count numbers comprise sub-steps 202-208. The routine starts at point 200 and proceeds to step 202. In step 202 pass and fail confidence targets are received from the user. These can be entered in any suitable manner, for example, by a keyboard. The actual setting of a confidence target is an economic decision based on the number of diagnostic errors that can be tolerated and the cost of making each measurement. Obviously, reducing the confidence target results in fewer average measurements and increased diagnostic errors. Alternatively, as the entered confidence target approaches 100%, the accuracy of discriminating a good DUT from a bad DUT increases, but the number of average measurements also increases significantly. However, with the inventive method, it is possible to productively use lower confidence targets.

After the pass and fail confidence targets have been entered and stored, the routine proceeds to step 204. Step 204 is used if Z-statistics will be used for the final measurement iterations. In step 204 the pass/fail limit Z-values ($Z_{pass}$ and $Z_{fail}$) are calculated in terms of the number of standard deviations to achieve the confidence targets entered in step 202. This calculation can be performed in a straightforward manner using a standard single-sided normal statistical distribution curve and determining the area under the curve by numerical integration or algebraic approximation in order to obtain the number of standard deviations necessary to obtain the desired confidence targets. In accordance with one aspect of the invention, separate Z-value limits may be computed for passing a unit and for failing a unit and these two limits can be associated with a single device parameter pass/fail limit or dual device parameter pass/fail limits. The $Z_{pass}$ value is expressed as a positive number and the $Z_{fail}$ value is expressed as a negative number.

The routine then proceeds to step 206 in which statistical values are computed for use with the Student-t test method as will be described below. In particular, in accordance with the conventional application of Student-t statistics, a two-dimensional table of pass/fail limits is built of t values which depend on the number of degrees of freedom and the entered confidence targets. Thus, for each particular number of degrees of freedom, there will be two t values, one for the pass confidence target and one for the fail confidence target. This table is constructed in a conventional manner according to well-known statistical techniques. The table is then stored for later use. When the table is actually used, the number of degrees of freedom will be determined from the effective number of measurements taken of the parameter being tested. This number of degrees of freedom will then be used to index into the table to extract the t values used to decide whether the pass or fail confidence targets have been met.

After storing both the Z parameters and t parameters in steps 204 and 206, the routine proceeds to step 208 in which the maximum number of measurements (maximum count) is received from the user. The choice of this value is related to the maximum cost that the user is willing to incur on a worst case measurement cycle which occurs when an actual parameter value is very close to the pass/fail limit. In this case, the number of required measurements can increase almost indefinitely. Consequently, a practical implementation of the method must limit the maximum number of measurements to a reasonable value.

A reduction in the maximum count significantly lowers measurement costs, but reducing it below some DUT-specific value will result in significantly increased diagnostic errors. The proper value can be ascertained from the DUT parameter and measurement error distributions. For very accurate discrimination of good and bad DUT's, the maximum count should be set sufficiently high that it is rarely encountered. In test cases where two separate measurements are selectively used to reduce the overall average cost of testing (a paired measurement system, as will be hereinafter explained in detail), a maximum count must be entered for each test (Max Count1 and Max Count2 in step 208). The confidence threshold and maximum count routine then ends in step 210.

Referring back to FIG. 1, after the confidence targets and maximum counts have been set, the routine proceeds to step 116 in which it is determined whether a single DUT is to be measured or multiple DUTs are to be measured. The former case might occur, for example, if a single part is to be measured, whereas the latter case corresponds to a production testing environment. In the case of a single DUT, the use of Z-statistics may not be appropriate since their use requires that an estimate of the standard deviation of the measurement error be accurately determined. Since this estimate generally requires that a large number of initial measurements be taken, the Z-statistical method is inefficient when only a single DUT is to be measured. Student-t statistics do not require an estimate of the standard deviation and are thus more efficient when only a single DUT is to be measured.

If only a single DUT is to be measured, the routine proceeds, via path 118, to step 122 in which a decision is made whether to pass or fail the unit by means of Student-t statistics. The Student-t statistical method and its application to testing will be explained in greater detail hereinafter in connection with the description of FIGS. 11–17.

If, alternatively, in step 116, multiple DUTs are to be measured, the routine proceeds, via path 120, to step 124 in which a "production test" using the illustrative test method is performed. The production test method steps are shown in more detail in FIG. 3.

More specifically, the production test routine starts in step 300 and proceeds to initialize test parameters in steps 302 and 304. In step 302, an estimate is made of the standard deviation of the measurement error. This estimate can be calculated by performing multiple measurements of the same parameter on a single DUT to obtain a measurement population (as previously mentioned, it is assumed that the standard deviation is constant from DUT to DUT so that these measurements can be made on any DUT). The estimate (S) of the standard deviation ($\sigma$) of the measurement error is then obtained by means of Equation (1) above.

After the estimate S has been determined in step 302, the routine proceeds to step 304. In step 304, a determination is made as to whether a paired test will be performed. A paired test is appropriate in certain circumstances where either of two measurement methods on a single parameter can be performed to determine whether the DUT is to be passed or failed. If the cost of one measurement differs significantly from the cost of the other measurement, in accordance with another aspect of the invention, it may be possible to minimize the overall test costs. More specifically, in the case where two measurements for the same parameter are available, a value called the cost-variance product is used to determine which of the two tests should be performed in any given point in the measurement sequence. The cost variance product is the cost of a test multiplied by the variance (standard deviation squared) of the measurement error in the parameter values measured by that test. The method of using the cost-variance product to determine which test shall be used is described in further detail hereinafter.

Figure 4:
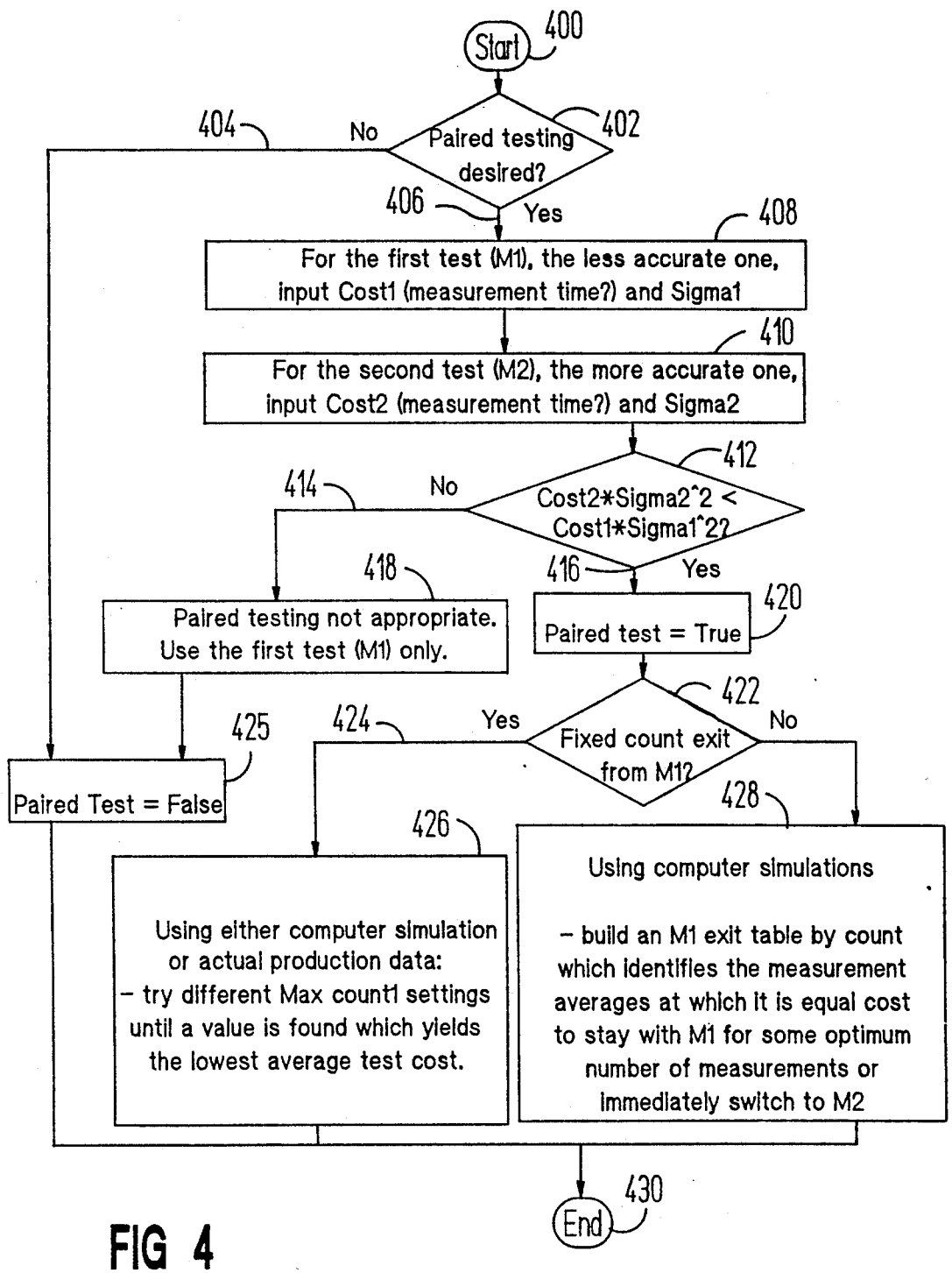
FIG. 4 is an illustrative schematic diagram of the steps used to perform the paired test setup set forth in step 304 of FIG. 3.

A method for implementing a paired test set up is shown in FIG. 4. The method starts in step 400 and proceeds to step 402 in which a decision is received from the user as to whether paired testing should be implemented or not. If not, the routine proceeds, via path 404, to step 425 in which a paired test flag variable is set equal to "false". This flag variable controls the implementation of the paired test in subsequent steps of the routine. After setting the paired test variable in step 425, the routine proceeds to the end 430.

Alternatively, if, in step 402, paired testing is desired, the routine proceeds, via path 406, to step 408. For convenience it is assumed that each test produces a different measurement and that the measurements have different accuracy. The less accurate measurement (arbitrarily designated as M1) is considered first. In order to calculate the cost-variance product, the cost of measurement M1 (Cost1, which may be related to the time taken to perform measurement M1) is received from the user along with the standard deviation (Sigma1) for that test. The standard deviation can be measured or calculated for the test under consideration. The routine then proceeds to step 410 where the cost (Cost2) and standard deviation (Sigma2) of the second measurement is received from the user.

At the next step, 412, the cost-variance products are calculated and compared. The cost variance product for the second measurement (the more accurate one) is calculated by multiplying Cost2 for that measurement by its variance (the square of its standard deviation (Sigma2)$^2$). In a similar manner, the cost-variance product of the first measurement (the less accurate measurement) is calculated by multiplying Cost1 by (Sigma1)$^2$.

The two cost-variance products are then compared in order to determine if a paired test method is appropriate. If the cost variance product for the more accurate test is greater than the cost variance product for the first test (the less accurate one) then the second test is always more costly than the first test and the first test should be used exclusively. In this case paired testing is not appropriate so the routine proceeds, via path 414, to step 418 in which the first test (measurement M1) is used exclusively. The routine then proceeds to step 425 in which the paired test flag variable is set "false" to disable paired testing for the rest of the test sequence. The routine then proceeds to the end 430.

If a comparison of the cost-variance products indicates that the overall testing cost could be reduced by switching from the first test to the second test at some point during the test sequence, the routine proceeds, via path 416, to step 420 in which the paired test flag variable is set to "true" to cause the routine in later steps to implement a paired test sequence. From step 420, the routine proceeds to step 422 in which a determination is made of the point at which the testing routine will switch from using the first test to the second test.

Generally, the test sequence is begun using the first test which generates measurement M1 (an M1 test), the less accurate measurement, and is continued until the DUT either passes or fails or the "projected costs" of further M1 tests exceeds the projected cost of the M2 tests. At this point M2 tests are used for all further measurements until pass/fail resolution is achieved. Consequently, a determination must be made as to the point in the test sequence when the projected costs of further M1 tests exceeds that of the M2 tests.

The switch point can be determined in at least two ways. One method of doing this is to use a predetermined, fixed M1 test count for the transition point between M1 tests and M2 tests. Alternatively, the transition from M1 tests to M2 tests can be governed by a table which is indexed by the measurement count and identifies the measurement averages at which there is an equal cost to continue using M1 tests for a predetermined number of tests or to immediately switch to M2 tests. The choice between the two ways must be decided by the user.

In step 422 the user's choice is received. If a fixed count exit from the M1 tests is selected by the user, the routine proceeds, via step 424, to step 426. In step 426, the fixed count value is determined using either a computer simulation or actual production data. For a computer simulation procedure, a straightforward iteration routine is used in which different Max Count1 settings (Max Count1 determines the maximum M1 measurements obtained) are used until a value is found which yields the lowest average cost. This simulation can be performed in a known and conventional manner to calculate the fixed count exit value.

It is also possible to determine the transition point by a simple "rule-of-thumb" method, such as a fixed number of M1 measurements which number is determined in advance by the user without resorting to a computer simulation.

Alternatively, if, in step 422, it is determined that a fixed count exit from the M1 testing routine is not desired, then the routine proceeds, via path 429, to step 428 in which a computer simulation is used to build an M1 test exit table by identifying the M1 measurement average corresponding to a test count at which there is an equal cost to continue with M1 tests for some optimum number of measurements or to immediately switch to using M2 tests. For dual limit testing, this table would contain four numbers for each test count number. These numbers are called $L_{fail}$, an average on the failing side of the low pass/fail limit; $L_{pass}$, an average on the passing side of the low pass/fail limit; $H_{fail}$, an average on the failing side of the high pass/fail limit and $H_{pass}$ an average on the passing side of the high pass/fail limit. In either case, the routine then proceeds to the end at step 430.

Returning to FIG. 3, the next decision that must be made in the illustrative production test routine is whether the estimated standard deviation of the measurement error computed in step 302 is constant from DUT to DUT. If this is the case, then the production test can use the preferred Z-statistics measurement technique described below. In this case, the routine proceeds, via path 308, to step 310.

Alternatively, if the estimated standard deviation of the measurement varies from DUT to DUT, then the Z-statistics method is not generally applicable and the routine proceeds, via path 312, to step 314 in which a further check is made to determine whether the measurement noise is normally distributed. This determination can be made from a knowledge of the measurement noise statistics. If the noise is not normally-distributed, then neither Z-statistics nor Student-t statistics can be used in the remainder of the routine presented below.

Consequently, the routine proceeds, via path 316, to step 322 at which another testing method must be used. For example, it may be possible to conduct a sufficient number of measurements to accurately estimate the standard deviation of the measurement error for a particular DUT. In this case, the Z-statistics test method can be used to conduct the final testing for that unit. It may also be possible to estimate the standard deviation of the measurement noise during the actual test operation without making a prior noise analysis.

Alternatively, if, in step 314, the measurement noise is determined to be normally distributed, then the routine proceeds, via step 318, to step 320 in which a Student-t statistical method is used as will be hereinafter discussed in detail in connection with FIGS. 11–17.

Assuming that the standard deviation of the measurement error is a constant from DUT to DUT, the preferred Z-statistics method can be used as set forth in step 310. The steps in performing the Z-statistics test method are shown in detail in FIG. 5. In particular, the Z-statistics routine starts in step 500 and proceeds to step 502. In step 502, at the start of the testing sequence the first DUT is obtained and placed in testing position and the testing unit is setup for measuring the first parameter. After the testing routine is started the routine returns to step 502 either to set up the testing machine to perform a measurement of a new parameter on a DUT which has previously been tested or to place a new DUT into testing position if the previous testing sequence has been completed.

After preparing the test machine, the routine then proceeds to step 504 in which parameters for the Z-statistics routine are initialized. In step 504 the $Z_{pass}$ and $Z_{fail}$ limits for the parameter are retrieved and various process variables are initialized if an initial test is being performed on a particular DUT. These process variables include a count variable (Count) which equals the number of measurements that have been taken for a particular parameter and a sum value (Sum) which is the sum of all of the measurement values. The Count and Sum process variables are used to calculate a running measurement average and in the calculation of the present Z-value.

The routine then proceeds to step 506 in which a simple Z-test is performed on the DUT. The Z-test is actually an iterative test in which measurements are repetitively taken of the selected parameter until the DUT status is resolved (passed or failed) or the maximum measurement count is reached. The steps involved in a simple iterative Z-test are shown in more detail in FIG. 6. In particular, the Z-test starts in step 600 and proceeds to step 602. In step 602, a measurement of the selected parameter is made and the Count process variable is incremented by one.

The routine then proceeds to step 604. In step 604, a choice is made as to whether a "Sigma test" is to be performed after each measurement. This choice is made by the user before the testing routine is started and serves as an additional check that the noise characteristics of the DUTs continue to be suitable for resolution by Z-statistics. In the Sigma test, after each measurement is made, a new value of the estimated standard deviation is calculated and compared to the expected value determined in step 302 by means of standard statistical tests to determine whether the test is still valid.

In particular, if, in step 604, it is determined that a Sigma test is to be performed, the routine proceeds, via path 608, to step 610. In step 610, a new estimate is made of the standard deviation of the measurement error (using a standard equation such as equation (1) above) and is compared to an expected value which had been previously calculated and stored in step 302. This comparison may be done using conventional statistical tests and if the new estimate is not within an acceptable range then a "Sigma" error is indicated and the routine exits to an error routine via path 612. Alternatively, the routine proceeds to step 614. If, in step 604, it is has been determined that no Sigma test is to be performed, the routine proceeds directly to step 614 via path 606.

In step 614, a new measurement average is computed by adding the latest measurement value to the Sum process variable previously mentioned and dividing by the Count process variable determined in step 602. Alternatively, if a number of measurements are taken and averaged in order to obtain a measurement value, then it is also possible to compute a measurement average by weighting each measurement value by the number of measurements which were averaged to obtain that value. This latter method allows for the number of measurements which are averaged to obtain a value to vary from DUT to DUT.

The routine then proceeds to step 616 in which a $Z_{high}$ value is calculated by subtracting the average computed in step 614 from the High Limit previously entered by the user (in step 112, FIG. 1) and dividing the result by the quotient of the estimated Sigma (from step 302, FIG. 3) divided by the square root of the Count variable determined in step 602.

The routine then proceeds to step 618 in which a $Z_{low}$ value is calculated in a similar manner to the $Z_{high}$ value using the Low Limit previously entered by the user (in step 112, FIG. 1), the estimated Sigma (from step 302, FIG. 3) and the Count variable.

The routine then proceeds to step 620 in which the computed $Z_{low}$ and $Z_{high}$ values are compared to the $Z_{pass}$ limit previously computed and stored in step 114 of FIG. 1. If both the $Z_{low}$ and $Z_{high}$ values are greater than the $Z_{pass}$ value in step 620, then the underlying null hypothesis (that the particular DUT measurement comes from a population centered exactly at the pass-/fail limit) is rejected, the DUT is passed and the routine proceeds, via step 622, to the "PASS" outcome.

Alternatively, if, in step 620, the inequality conditions are not met, the routine proceeds, via path 624 to step 626. In step 626, the $Z_{low}$ and $Z_{high}$ values are compared to the $Z_{fail}$ limit computed and stored in step 114 (FIG. 1) in order to determine whether the DUT is to be failed. If, in step 626, either the $Z_{low}$ or Zhigh value determined in steps 616 and 618, respectively, fall below the $Z_{fail}$ limit value, the null hypothesis is again rejected and the unit failed. The routine proceeds to the "FAIL" outcome 628.

Alternatively, if, in step 626, the null hypothesis is not rejected (both $Z_{low}$ and $Z_{high}$ values are greater than the $Z_{fail}$ limit), the routine proceeds, via path 630, to step 632 in which a determination is made whether a maximum count situation or a predetermined exit from the paired test routine has occurred.

Figure 8:
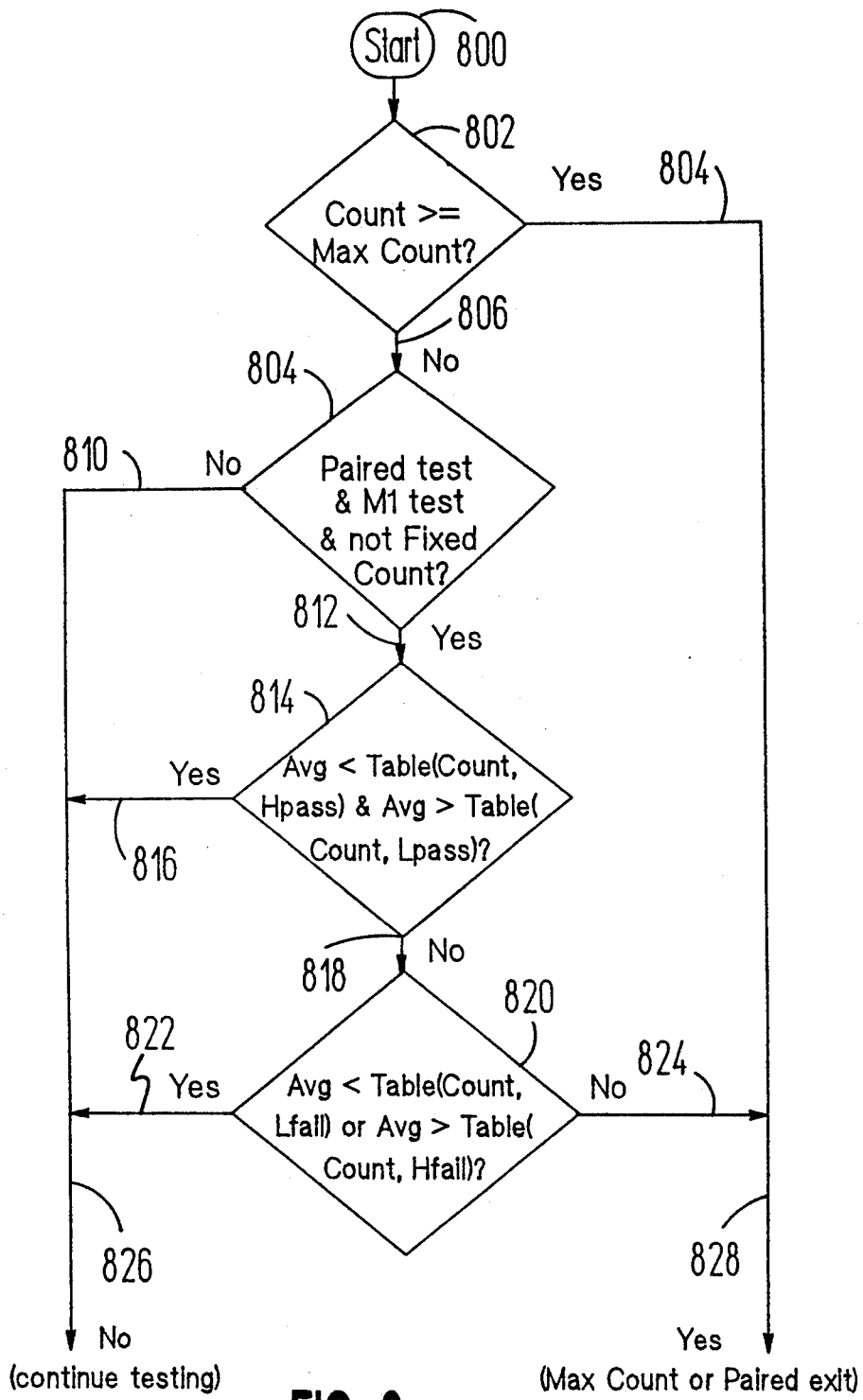
FIG. 8 is an expansion of step 632 in FIG. 6 showing an illustrative method of determining whether another measurement should be taken.
Figure 9:
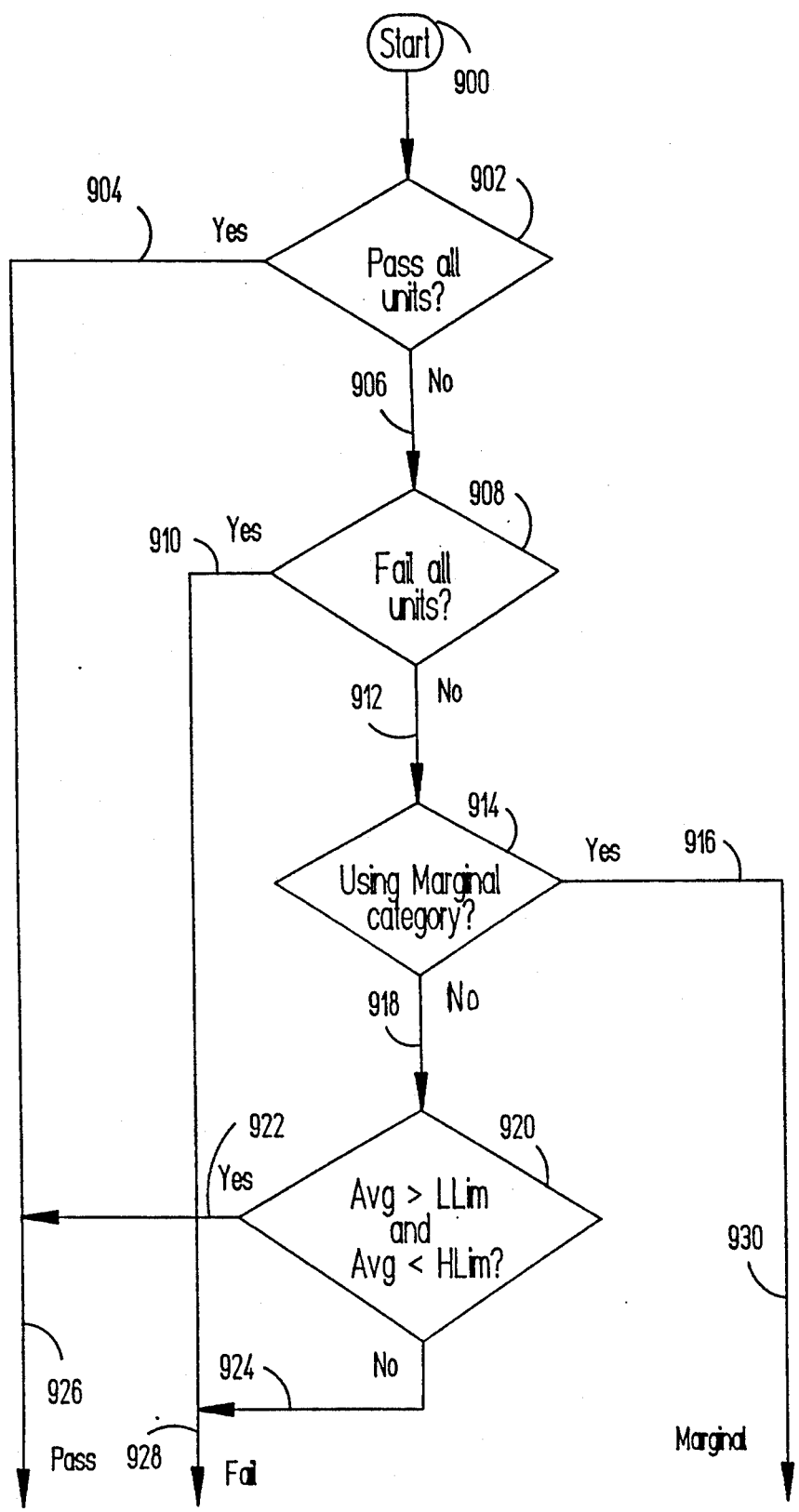
FIG. 9 is an expansion of step 518 in FIG. 5 illustrating an illustrative maximum count processing routine.

An expansion of step 632 is shown in detail in FIG. 8. As shown in FIG. 8, the routine starts in step 800 and proceeds to step 802 in which the present Count process variable is compared to the Max Count number previously entered by the user in step 208 (FIG. 2). In the case of a non-paired test, the Max Count is simply the maximum count entered for the single test sequence. The same also holds for a paired test sequence in which the transition point between M1 testing and M2 testing occurs at a fixed M1 test count. In this latter case, the Max Count number is set to the fixed M1 text transition point. If the Count process variable is greater than, or equal to, the Max Count, the routine proceeds, via step 604, to indicate at outcome 828 that the maximum number of measurements, or the M1 to M2 transition point has been reached.

Alternatively, if, in step 802, the measurement count remains below the Max Count number, the routine proceeds, via path 806, to step 808, in which a determination is made if a special paired test exit situation exists. As previously mentioned, in some cases the change from the M1 test sequence to the M2 test sequence is determined by a fixed M1 test count, but, in other cases, the transition point is determined by a precalculated table.

In step 808, the routine evaluates the conditions which indicate whether a table-based exit has been selected. These conditions include: selection of a paired test (determined by examining the paired test flag variable set in steps 420 and 425); a determination that the M1/M2 transition has not already occurred (M1 test sequence still running) and there is not a fixed M1 count transition point.

Figure 6:
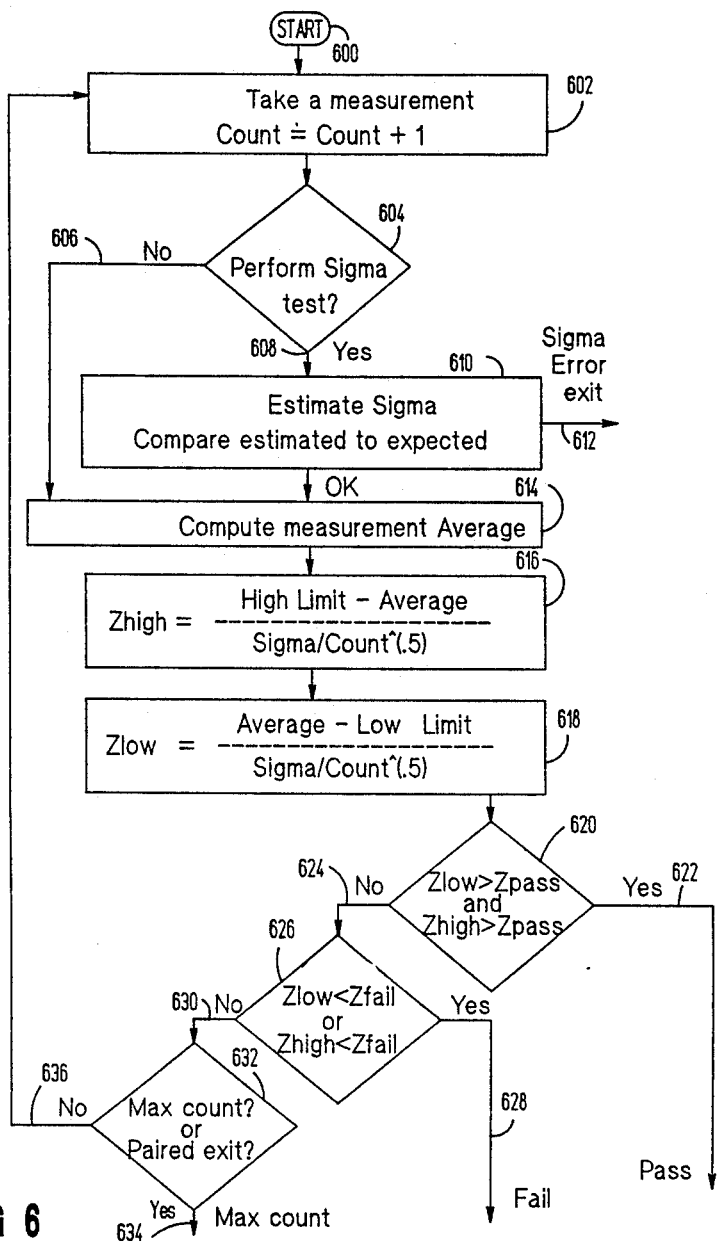
FIG. 6 is an expansion of step 506 in FIG. 5 in which the inventive iterative measurement method is illustrated involving the calculation of Z-values for the DUT.

If the aforementioned conditions are met, then the routine proceeds via step 812 to step 814 in order to test for a table-based exit. However, if one of the conditions in step 808 is not met, then a paired test exit is not appropriate and the routine proceeds via path 810 to outcome step 826 which indicates that continued testing is necessary. Referring to FIG. 6, this latter outcome causes the routine to branch, via path 636, back to step 602, in which another measurement is taken and the procedure is repeated.

Alternatively, if, in step 808, the stated conditions are met, the routine proceeds, via path 812, to step 814, the measurement average is compared to the table entries which depend on the present measurement count (contained in the Count process variable) and whether a "high" ($H_{pass}$ and $H_{fail}$) or "low" ($L_{pass}$ and $L_{fail}$) limit is being tested If the average falls between the high pass and low pass table measurement averages corresponding to the current measurement count, then a paired exit is not appropriate and the routine proceeds, via path 816, to the continue outcome 826.

Alternatively, if the table comparison inequalities are met, the routine proceeds, via path 818, to step 820, in which the average is compared to the low and high fail limits corresponding to the current measurement count). If, in step 820, the current measurement average is less than the low fail table average or greater than the high fail table average, then a paired exit is not proper and the routine proceeds, via path 822, to the continue outcome 826. Alternatively, if, in step 820, both of the listed inequalities are not met, then a paired exit is appropriate and the routine proceeds, via path 824, to the paired exit outcome 828. Referring to FIG. 6, the latter outcome causes the routine to perform a paired exit at step 634, thus completing the simple Z-test.

Figure 5:
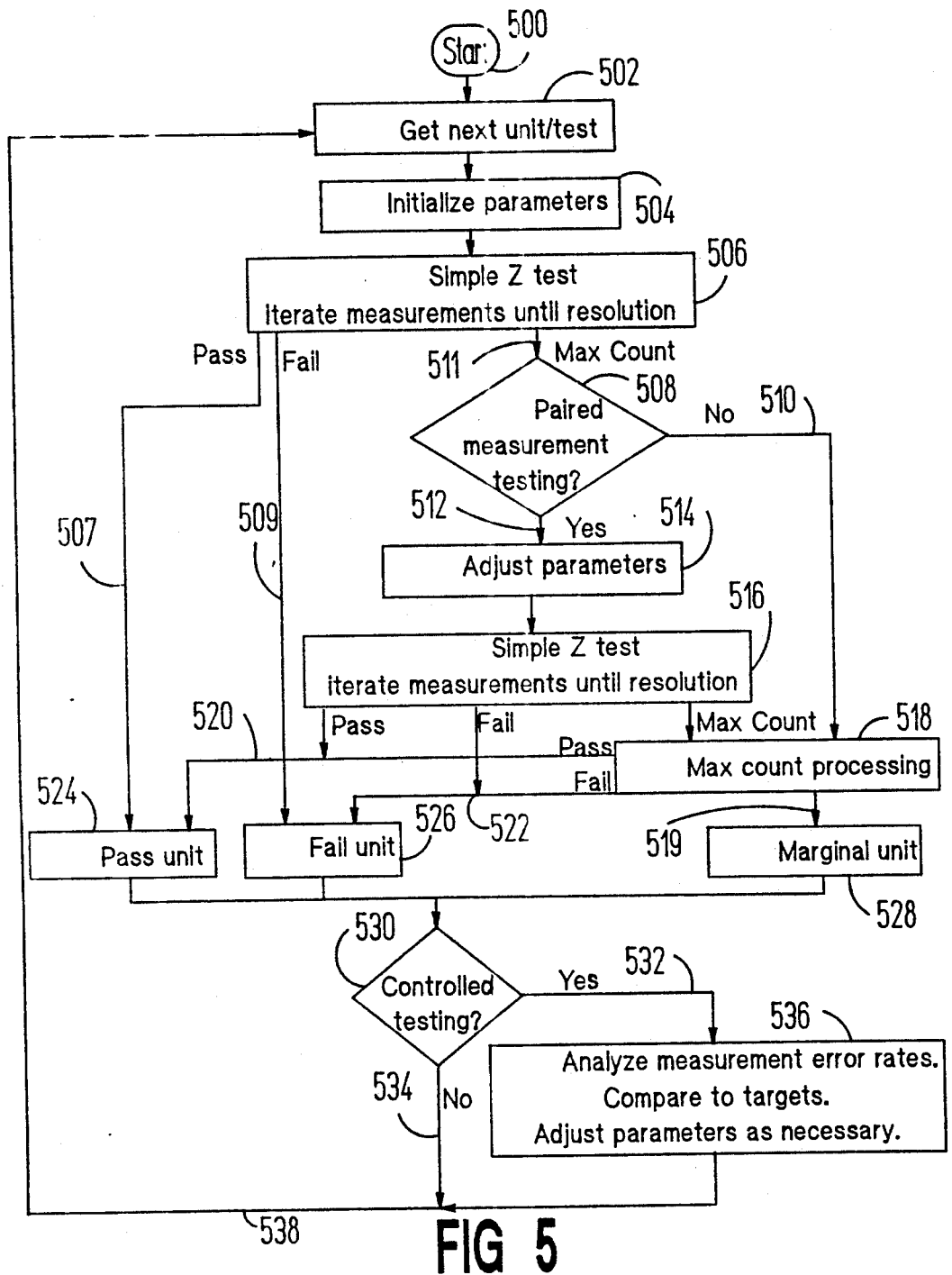
FIG. 5 is an illustrative schematic of the steps involved in setting up a test sequence on a DUT using the illustrative Z-statistics method set forth in step 310 of FIG. 3.

Referring now back to FIG. 5, the outcome of the simple Z-test in step 506 results in progress along one of paths 507, 509 and 511. In particular, a "PASS" outcome of the simple Z-test results in the DUT being passed and the routine proceeds along path 507 to step 524, in which the unit is marked, or allocated, as passed. Alternatively, if the Z-test routine results in an indication that the DUT has failed, then the routine proceeds, via path 509, to step 526, in which the unit is marked as failed.

The third alternative in which the maximum measurement count is reached, results in the routine following path 511 to step 508 in which a check is made to determine whether paired measurement testing is in effect. If not, the routine proceeds, via path 510, directly to step 518 in which further processing of the unit is conducted as will hereinafter be explained.

Figure 7:
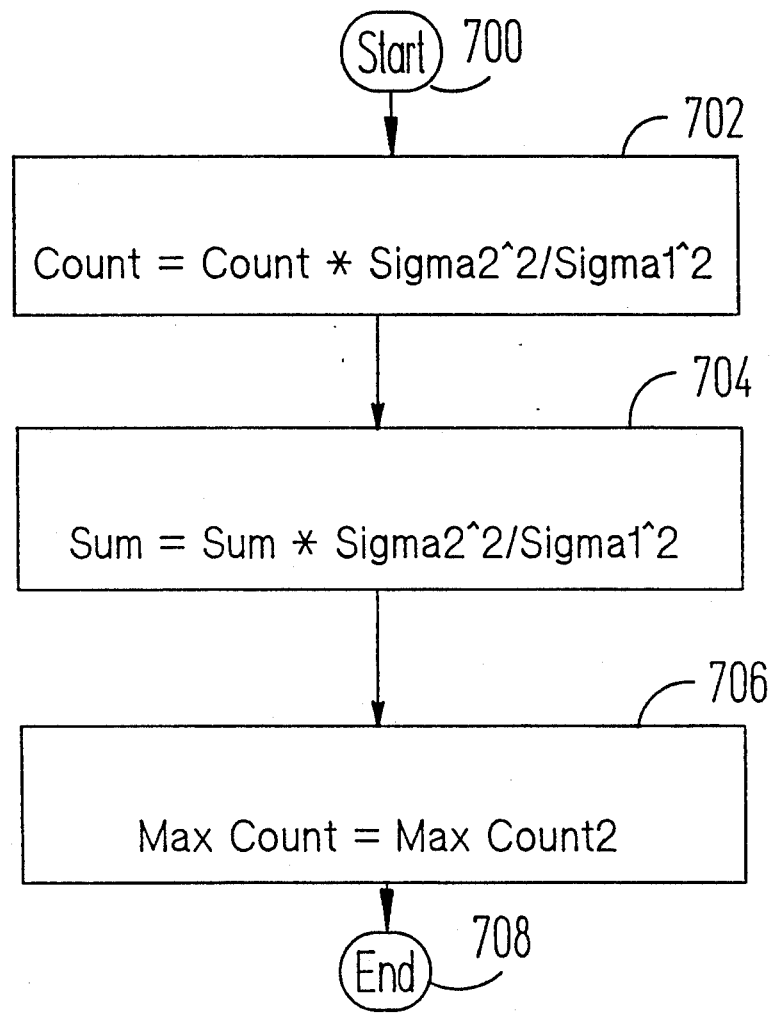
FIG. 7 is an expansion of step 514 in FIG. 5 illustrating how the measurement parameters can be adjusted to accommodate a paired measurement method.

Alternatively, if, in step 508, a determination is made that paired measurement testing is being used, then the routine proceeds, via path 512, to step 514, in which selected test parameters are adjusted to account for the M1 testing already completed so that the test sequence can be continued with M2 tests. In particular, a sequence of steps involved in an illustrative adjustment of the test parameters (process variables) is shown in. FIG. 7. From start step 700, the routine proceeds to step 702, in which measurement count (Count) process variable is adjusted by multiplying it by the ratio of the variances for the two tests ($Sigma2^2/Sigma1^2$). The routine then proceeds to step 704 in which the running sum of the measurement values is adjusted by the same variance ratio in order to adjust from the effect of the previous M1 testing.

In step 706, the Max count limit is set to Max Count2 (the Max Count limit for the second measurement). The parameter adjustment routine then ends in step 708.

Referring back to FIG. 5, after the parameters have been adjusted in step 514, the Z-test is then again performed in step 516 using measurement M2. The Z-test (shown in FIG. 6) results in three resolutions (PASS, FAIL, and MAX COUNT reached). If the unit is resolved as PASS in accordance with the Z-test as previously described the routine proceeds by path 520 to step 524 in which the DUT is marked as passed. Alternatively, if step 516 results in a FAIL resolution, then the routine proceeds, via path 522, to step 526 in which the DUT is marked as failed.

A Max Count resolution in step 516 results in the routine proceeding to step 518. Max Count processing in accordance with step 518 is shown in more detail in FIG. 9. Max Count processing depends on a user-selected implementation of the inventive method. In particular, one choice (and the conventional method of treating the DUT in this situation) would be to pass or fail the DUT based on its current test measurement average.

Other choices are also available. For example, another choice is either to pass or fail all units which reach the Max Count limit. Due to the Z-test operation, these latter units probably have true parameter values quite close to the predetermined pass/fail limit. Consequently, the user may decide that such parameter values are acceptable and pass all units if the pass/fail limits are conservative or may fail all units if the pass/fail limits are rigid and the user is conservative. Still another more unconventional choice is to designate such DUTs as "marginal". The inventive test method can identify marginal devices and also determine the probability that the device is actually good or bad. The choice then can be left to the user to determine the disposition of these DUTs.

Referring back to FIG. 9, in step 902, the user may have decided in Max Count processing that all units that reach the maximum count should be passed. In this case, the routine proceeds, via path 904, to the PASS outcome 926. Alternatively, if the user has decided that all Max Count units should fail, the routine proceeds, via path 906, to step 908, and, via path 910, to the FAIL outcome 928.

A negative response in step 908 causes the routine to proceed, via path 912, to step 914. In this step, a check is made to see whether a "marginal" category is being used. If so, the routine proceeds, via path 916, to the MARGINAL output 930. If, in step 914, a determination is made that a "marginal" category is not being used, the routine proceeds, via path 918, to step 920, in which the measurement average is compared to the low and high test limits to see whether the unit either passes (via path 922) or fails (via path 924).

In any case, referring to FIG. 5, after the DUT has been resolved into one of the three categories (pass, fail or marginal) in step 518, the PASS outcome causes the routine to proceed, via path 520, to step 524 in which the DUT is marked as passed. The FAIL outcome from step 518 causes the routine to proceed, via path 522, to step 526, in which the DUT is marked as failed. A marginal outcome in step 518 causes the routine to proceed, via path 519, to step 518, in which the DUT is marked as marginal.

After the DUTs have been marked, the routine proceeds to step 530. In accordance with another aspect of the invention, it is possible for the test method to "feedback" information obtained during the testing sequence to dynamically modify the test pass/fail limits so that system error rates approach desired error rates associated with the confidence levels originally set by the user.

More particularly, in step 530, a check is made to determine whether the overall "feedback" is to be applied to dynamically alter the pass/fail Z-value limits and Max Count setting. If the answer is no, the routine proceeds, via paths 534 and 538 to step 502, in which the next unit is placed in the test position or the nest test is conducted.

Alternatively, if controlled testing is selected, the routine proceeds, via path 532, to step 536. In step 536, the present measurement error rates are analyzed and compared to the desired targets to determine whether the pass/fail limits should be adjusted to bring the calculated error rates into alignment with the desired targets.

Figure 10:
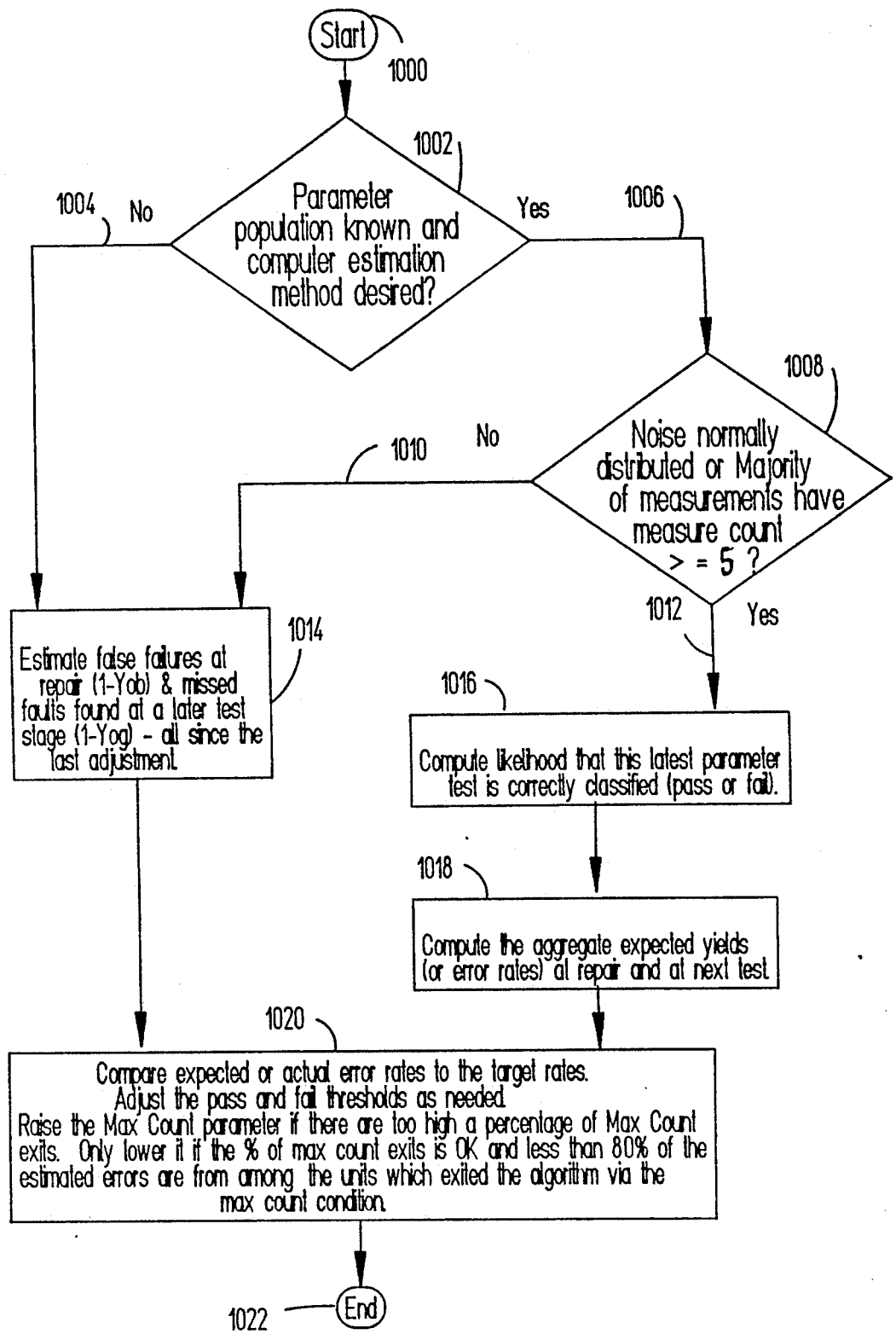
FIG. 10 is an expansion of step 536 in FIG. 5 illustrating an illustrative set of steps which might be used to compute measurement error rates from the numbers of units passed or failed, to compare the computed measurement error rates to predetermined target values and to adjust test parameters as necessary to make the computed error rates approach the target values.

An illustrative routine for analyzing measurement error rates and comparing them to desired targets is shown in more detail in FIG. 10. In particular, the illustrated routine starts in step 1000 and proceeds to step 1002. In step 1002, a check is made to determine whether characteristics of the parameter population are known and a computer estimation method is desired. If not, the illustrative feedback mechanism is not practical and the routine proceeds, via path 1004, to step 1014.

In step 1014, the output error rates are estimated. These consist of the false failures at repair, which are "good" DUTs that have been erroneously designated as FAILED (subsequent tests at the repair station will show that these units are, in fact, good). False failures at repair are equal to one minus the output yield to repair, which latter quantity is the number of bad units that were failed, divided by the total number of units that were failed and can be obtained either by estimation, or by analyzing actual data obtained at the repair station. The false failure estimate is obtained for units since the last pass/fail limit adjustment has been made in accordance with the invention.

In addition, the second error rate, which is the missed faults found at a later test stage, is also estimated or calculated. This latter error rate is the number of bad DUTs that were erroneously designated as PASSED and which failed a different subsequent test. The missed fault number is equivalent to one minus output yield to next test, which is the number of good DUTs that were passed, divided by the total number passed. Again, this number can be predicted or obtained from actual data and is obtained for DUT tested since the last adjustment in accordance with the inventive feedback mechanism.

The routine then proceeds to step 1020, in which estimated or actual error rates are compared to target rates. The target rates are, in turn, determined by the confidence level targets initially set by the user in step 114 (FIG. 1). For example, a confidence level of 0.999 corresponds to an error rate of 0.001. In order to properly adjust the system, if the estimated or actual error rate exceeds the corresponding target rate, then the corresponding pass/fail Z-value limit is adjusted to cause the estimated or actual rates to approach the desired target rates as set forth in step 1020. In particular, as previously-mentioned, the Z-value limit is calculated by determining the number of standard deviations of a normal distribution necessary to achieve the user-specified confidence level. In order to bring the actual error rates closer to the user-specified target rates, the initial Z-value limit is adjusted by increasing the number of standard deviations. In addition, the Max Count number may also be adjusted as indicated in step 1020. More particularly, if there are a large number of Max Count exits, the Max Count variable value is raised. The Max Count variable is only lowered if the percentage of maximum count exits is reasonable and less than 80% of the estimated errors come from among DUTs that exited the testing routine via the Max Count condition. After adjustments to the pass/fail limits have been made, the routine ends at step 1022.

Alternatively, if, in step 1002, a determination is made that the parameter population is known, and that a computer estimation method is desired, then the routine proceeds, via path 1006, to step 1008, in which a check is made to determine whether the measurement error noise is normally distributed or a majority of the measurements have a measurement count greater than five. This latter limit is used because if at least five measurements have been taken on each DUT, then, according to well-known statistical principles, the measurement error noise will approach the required normal distribution with acceptable accuracy. If the aforementioned criteria are not met, the routine proceeds, via path 1010, to step 1014 to estimate the error rates. Alternatively, if, in step 1008, the criterion are met, the routine proceeds, via path 1012, to step 1016.

In step 1016 the likelihood that the most recent test correctly classified the DUT (as passed or failed) is computed. In order to compute this likelihood, a numerical integration is performed over the failed and over the passed population functions to compute the fractional number of "good" ($N_{good}$) and "bad" ($N_{bad}$) units. These latter functions are derived from the product of the relative frequency of the DUT value (which requires knowledge of the DUT population), and probability of that value resulting in the average value actually computed for the DUT. The fractional numbers are given by the following equations:

$$N_{good} = \int_{Low\ Lim}^{High\ Lim} F(x) * P(x, Avg, Count, Sigma)dx \text{ and} \quad (3)$$

$$N_{bad} = \int_{-\infty}^{Low\ Lim} F(x) * P(x, Avg, Count, Sigma)dx + \int_{High\ Lim}^{\infty} F(x) * P(x, Avg, Count, Sigma)dx \quad (4)$$

where F(X) is the relative frequency distribution of the measured parameter across the entire population of units, P(x) is the probability that a unit whose true parameter value is "x" and has been measured "Count" times with a test measurement procedure that has a measurement noise error with a standard deviation of Sigma would have the average measurement value "Avg".

Accordingly, P(x) is given by:
$$P(x) = 1/(SigmaN * SQR(2\pi)) * \exp(-0.5*((x\text{-}Avg)/SigmaN)^2) \quad (5)$$

where SigmaN=Sigma/SQR(Count).

The fractional numbers in equations (3) and (4) can be obtained by numerical integration techniques. It has been found than an integration across a width of the distribution curve of approximately plus or minus eight standard deviations of the mean with the integration being split across the pass/fail limit results in satisfactory values (Avg−8*SigmaN to Avg+8*SigmaN).

Once the fractional numbers have been calculated, the probabilities of "good and "bad" units can be calculated simply by the following equations:

$$P_{good} = N_{good}/(N_{good} + N_{bad}) \quad (6)$$

and $$P_{bad} = N_{bad}/(N_{good} + N_{bad}) \quad (7)$$

The routine then proceeds to step 1018 in which the error rates at repair and next test are calculated from the $P_{good}$ and $P_{bad}$ values obtained in step 1016. More particularly, if the DUT has been failed, the fail error rate is re-calculated by computing a running sum, Fail Sum, by adding the $P_{bad}$ number determined in equation (7) to the running sum obtained for previous DUTs. The total number of failures (Fail Count) is incremented by one and a failure accuracy is computed by the following formula:

$$\text{Fail Accuracy} = \text{Fail Sum}/\text{Fail Count} \quad (8)$$

The Fail Error Rate is then 1−Fail Accuracy.
In a similar manner, if the current DUT has passed, then the pass error rate is re-calculated by computing a running sum, Pass Sum, by adding the $P_{good}$ number determined in equation (6) to the running sum obtained for previous DUTs. The total number of failures (Pass Count) is incremented by one and a pass accuracy is computed by the following formula:

$$\text{Pass Accuracy} = \text{Pass Sum}/\text{Pass Count} \quad (9)$$

The Pass Error Rate is then 1−Pass Accuracy. The routine then proceeds to step 1020 in which the error rates computed in step 1018 are each compared to user-specified target error rates. The pass/fail Z-value limits are then adjusted as described previously to cause the calculated error rates to more closely approach the target rates during testing of subsequent DUTs. The routine then ends in step 1022.

Referring back to FIG. 5, after step 536 has been completed and the test limits adjusted as necessary, the routine proceeds, via path 538, to step 502, in which the next unit or test is prepared. Steps 502–536 are then repeated until all tests have been completed.

The aforementioned Z-test is applicable for DUT populations in which standard deviation of the measurement error is constant from DUT to DUT. If such is not the case Z-statistics cannot be used reliably to resolve the pass/fail status of the DUT. However, in some cases, it is possible to use Student-t statistics to perform a similar test. Student-t statistics are standard statistical tests which are well-known. The basis for the Student-t test accordingly will not be discussed hereinafter in detail. Student-t statistical tests are also suitable if only a single DUT is to be tested (as previously described with respect to FIG. 1, step 116). In this latter case Student-t statistics can be used to eliminate the large overhead associated with the repeated measurements necessary to obtain an accurate estimate of the measurement error standard deviation for the Z-statistics test.

Figure 11:
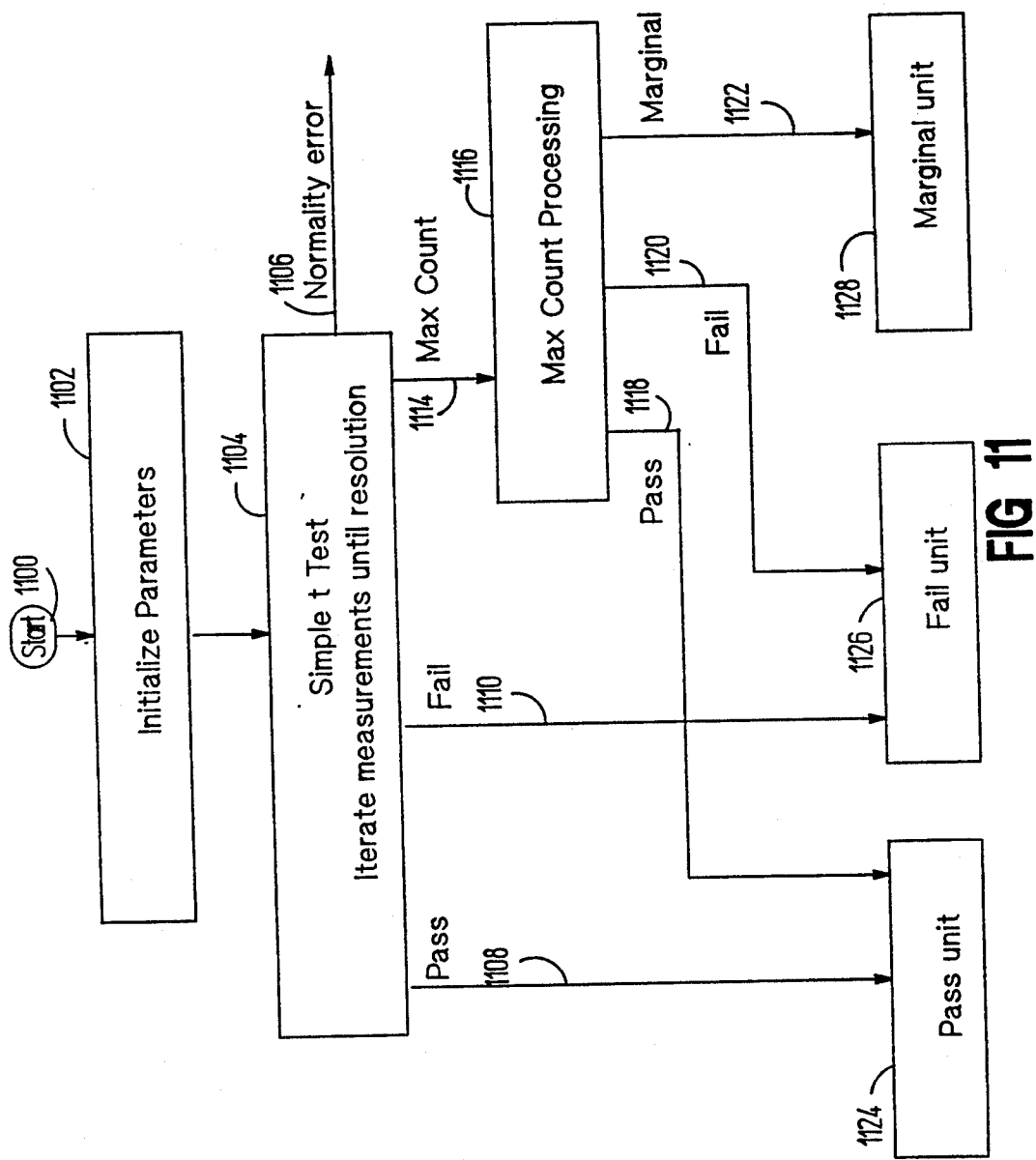
FIG. 11 is an illustrative routine showing the steps utilized if Student-t values are used to optimize test costs. Such a routine might be used in step 122 of FIG. 1 if measurements are to be performed on only a single DUT or, under appropriate conditions, in step 320 of FIG. 3, if tests on multiple units are to be performed.

More particularly, referring back to FIG. 1, if a single DUT is to be measured, the illustrative method can be used with Student-t statistics to perform the measurement as set forth in step 122. FIG. 11 shows an expanded routine to perform the single DUT measurement Student-t test set forth in step 122. In particularly, from start step 1100, the routine proceeds to step 1102, in which test parameters (such as the measurement count number and running sum) are initialized. The routine then proceeds to step 1104 to perform a simple t-test on the DUT. As with the Z-test previously mentioned, the simple t-test is an iterative test in which test measurements are repetitively taken until pass, fail, or maximum count resolution is reached, or a normality error is detected. A normality error causes the testing routine to transfer, via path 1106, to an error-handling routine. As previously mentioned, a strong assumption in using Student-t statistics is that the measurement error distribution is normal. If this is not the case, then Student-t statistics will not work successfully and other means must be used to test the unit.

Figure 12:
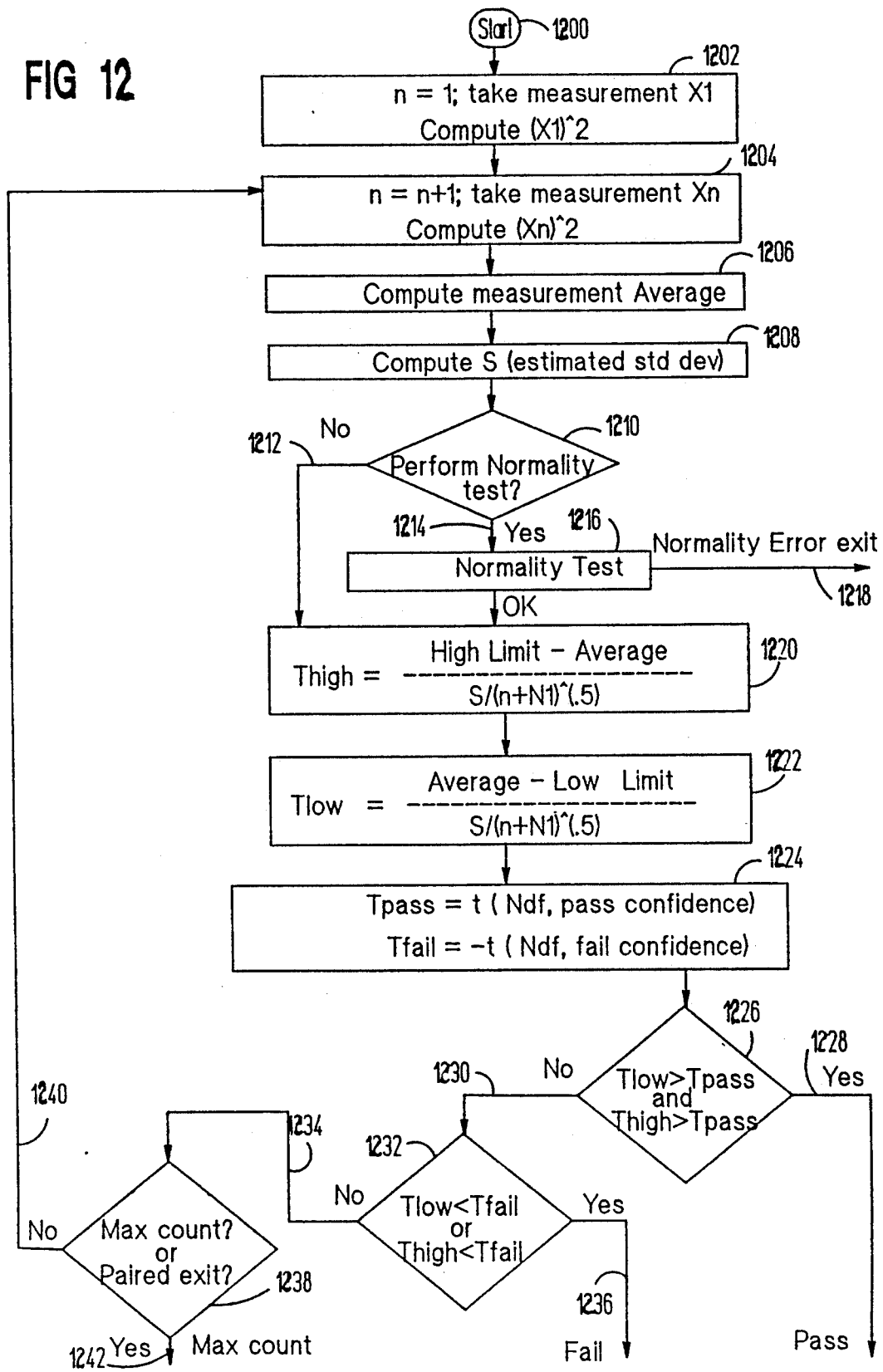
FIG. 12 is an expansion of step 1104 of FIG. 11 and steps 1306 and 1320 of FIG. 13 in which the Student-t values are calculated and used to determine whether the unit has passed or failed or additional measurements need to be taken.

FIG. 12 shows an expanded routine to perform the simple t-test set forth in step 1104. The t-test routine starts in step 1200 and then proceeds to step 1202, in which the measurement count process variable (n) is initialized to 1, and a first measurement (value X1) is taken. The value of the measurement is squared $(X1)^2$. The routine then proceeds to step 1204 in which the measurement count variable (n) is incremented and another measurement (Xn) is taken and its value squared. Thus, in order to prepare for the first test iteration, only two measurements are necessary instead of a large number of measurements necessary with Z-statistics to accurately establish the measurement error standard deviation. In step 1206, the measurement average is computed. The method of computing the measurement average is shown in more detail in FIG. 14.

In particular, the measurement average routine starts in step 14000 and proceeds to step 1402. In step 1402, the Sum process variable is computed by adding the measurement values starting with the value of the first measurement and continuing through the current measurement number (n). The routine then proceeds to step 1404. In step 1404, a determination is made as to whether a paired test sequence is in process and, if so, if there if there is an "M1 carryover". In the case of a measurement of a single DUT, there will never be an M1 carryover, since paired testing is not used. However, as will be hereinafter discussed, an M1 carryover may occur with repetitive production measurements. This latter case will hereinafter be discussed in detail, but is mentioned here for completeness. In a paired test situation, an adjustment of the running average of the test parameters is necessary in a paired testing sequence when the testing routine switches from M1 tests to M2 tests. This adjustment which is performed is related to the value of a carryover variable designated as N1. A method of determining the appropriate adjustment will be described in detail hereinafter (in connection with FIG. 16), which adjustment is related to the magnitude of the carryover variable, N1.

Assuming there is no M1 carryover, the routine proceeds, via path 1406, to step 1410, in which the measurement average is computed in a normal manner by dividing the Sum variable determined step 1402 by the measurement count (n) last updated in step 1204. The measurement average routine then ends in step 1414.

Alternatively, if, in step 1404, during a production measurement sequence, it is determined that a paired test sequence is being executed (by examining the paired test flag variable previously mentioned) and that there is an M1 carryover, the routine proceeds, via path 1408, to step 1412, in which an adjusted measurement average is computed by adding the sum of the measurement values taken by means of M1 tests (Sum1) to the current sum of the M2 test measurements and dividing the result by the carryover variable N1 (computed as discussed in connection with FIG. 16), plus the current measurement count (n). The routine then proceeds to end in step 1414.

Referring back to FIG. 12, the routine then proceeds to step 1208 in which an estimated standard deviation of the measurement error is computed. The estimated standard deviation is computed using the steps illustrated in detail in FIG. 15. More particularly, the estimated standard deviation routine starts in step 1500 and proceeds to step 1502. In step 1502, a temporary standard deviation estimate (squared) $S_{temp}^2$ is calculated by the formula shown in step 1502. The routine then proceeds to step 1504 in which a determination is made whether a paired test sequence is being executed and whether there is an M1 carryover as previously mentioned. If not, the routine proceeds, via path 1506, to step 1510 in which the estimated standard deviation is determined by taking the square root of the temporary quantity determined in step 1502. The routine then proceeds to step 1514 in which the number of degrees of freedom (Ndf) is set equal to the present measurement count less one (n−1). The routine then ends in step 1518.

If, in step 1504, it is determined that a paired test sequence is being executed and that there is an M1 carryover, the routine proceeds, via path 1508, to step 1512. In this step, the estimated standard deviation (S) is determined by adjusting the temporary estimated standard deviation computed in step 1502 by means of M1 carryover variable (N1) in accordance with the formula in step 1512. The routine then proceeds to step 1516 in which the number of degrees of freedom (Ndf) is determined by taking the integer value of the sum of the carryover variable (N1) plus the current measurement count (n) minus two. The routine then ends in step 1518.

Returning to FIG. 12, the routine then proceeds to step 1210 in which a decision is made as to whether to perform a normality test. This decision is predetermined by the user before the routine begins operation. Such a normality test can be used to insure that continuing measurement noise errors meet the criterion necessary to apply the Student-t test method. If a decision has been made by the user not to perform a normality test, the routine proceeds, via path 1212, to step 1220 in which a high t-value is computed.

Alternatively, if, in step 1210, it is decided by predetermined user decision that a normality test is required, the routine proceeds via path 1214 to step 1216 in which a normality test is performed. This test may illustratively be a standard statistical test to determine whether the measurement error values are normally distributed. As such the details of the test will not be discussed further herein. If it is determined that the measurement error is not normally distributed then a normality error exit occurs, via path 1218, to an error routine and the testing sequence ends. Alternatively, the routine proceeds to step 1220 to calculate the high t-value.

In step 1220 a high t-value ($T_{high}$) is determined by subtracting the measurement average determined in step 1206 from the "high" test limit entered in step 112 and dividing the result by the estimated standard deviation determined in step 1208 divided by square root of the sum of the current measurement count plus the M1 carryover variable (N1).

The routine then proceeds to step 1222 in which a low t-value ($t_{low}$) is determined in the similar manner by subtracting from the measurement average determined in step 1206, the low limit entered by the user in step 112 (FIG. 1) and dividing the result by the estimated standard deviation determined in step 1208 divided by the square root of the current measurement count plus the M1 carryover variable (N1).

The routine then proceeds to step 1224 in which pass and fail limit t-values ($t_{pass}$ and $t_{fail}$) are determined by examining a t-value table which relates values to the number of degrees of freedom and to a confidence level. The values in this table are pre-computed and stored so that they can be quickly retrieved during this step of the test procedure. The construction and derivation of such a table is well-known and such tables can be found in standard statistical textbooks. The table is used to select a t-value based on the number of degrees of freedom calculated in steps 1514 or 1516 (FIG. 15), a pass confidence level target entered by the user in step 114 (FIG. 1), and a fail confidence level target also entered in step 114.

The routine then proceeds to step 1226 in which the computed $t_{low}$ and $t_{high}$ values are compared to the pre-computed $t_{pass}$ limit retrieved in step 1224. If both the $t_{low}$ and $t_{high}$ values are greater than the $t_{pass}$ value in step 1226, then the underlying null hypothesis (that, for each limit, the particular DUT measurement comes from a population centered exactly at the pass/fail limit) is rejected, the DUT is passed and the routine proceeds, via path 1228, to the "PASS" outcome.

Alternatively, if, in step 1226, the inequality conditions are not met, the routine proceeds, via path 1230 to step 1232. In step 1232, the $t_{low}$ and $t_{high}$ values are compared to the pre-computed $t_{fail}$ limit retrieved in step 1224 in order to determine whether the DUT is to be failed. If, in step 1232, either the $t_{low}$ or $t_{high}$ value determined in steps 1222 and 1220, respectively, fall below the $t_{fail}$ limit value, the null hypothesis is again rejected and the unit failed. The routine proceeds to the "FAIL" outcome 1236.

Alternatively, if, in step 1232, the null hypothesis is not rejected (both $t_{low}$ and $t_{high}$ values are greater than the $t_{fail}$ limit), the routine proceeds, via path 1234, to step 1238 in which a determination is made whether a maximum count situation or a predetermined exit from the paired test routine has occurred. The maximum count and paired exit routine is shown in detail in FIG. 8 and discussed in connection with that figure above. The result in step 1238 is that a maximum count condition is encountered and the routine proceeds via outcome 1242 or another measurement is needed for resolution and the routine proceeds, via path 1240 to step 1202 to perform another measurement.

Returning to FIG. 11, the results of the simple t-test are a PASS, FAIL or MAX COUNT exit.

If the unit is resolved as PASSED in accordance with the t-test as previously described, the routine proceeds by path 1108 to step 1124 in which the DUT is marked as passed. Alternatively, if step 1104 results in a FAIL resolution, then the routine proceeds, via path 1110, to step 1126 in which the DUT is marked as failed.

A Max Count resolution in step 1104 results in the routine proceeding to step 1116. Max Count processing in accordance with step 1116 is shown in more detail in FIG. 9 and depends on a user-selected implementation of the inventive method as discussed in detail with regard to the latter figure. As illustrated, the Max Count processing step 1116 results in one of three outcomes: PASS, FAIL or MARGINAL.

In any case, referring to FIG. 11, after the DUT has been resolved into one of the three categories in step 1116, the PASS outcome causes the routine to proceed, via path 1118, to step 1124 in which the DUT is marked as passed. The FAIL outcome from step 1116 causes the routine to proceed, via path 1120, to step 1126, in which the DUT is marked as failed. A marginal outcome in step 1116 causes the routine to proceed, via path 1122, to step 1128, in which the DUT is marked as marginal.

The t-test routine illustrated in FIG. 12 may also be used in a production environment for DUT populations in which the standard deviation of the measurement error is not constant from DUT to DUT. For example, in a production test environment, a sigma test may indicate the estimated standard deviation is changing from DUT to DUT. In this case Z-statistics are not appropriate for use with the inventive method. However, Student-t statistics may be appropriate if the measurement error noise is normally distributed. Such a situation may occur, for example, in step 320 of FIG. 3 as previously discussed. In this case a method consisting of steps similar to those shown in FIG. 5 in connection with the Z-statistics method may be used. Such a method is illustrated in FIG. 13.

Figure 13:
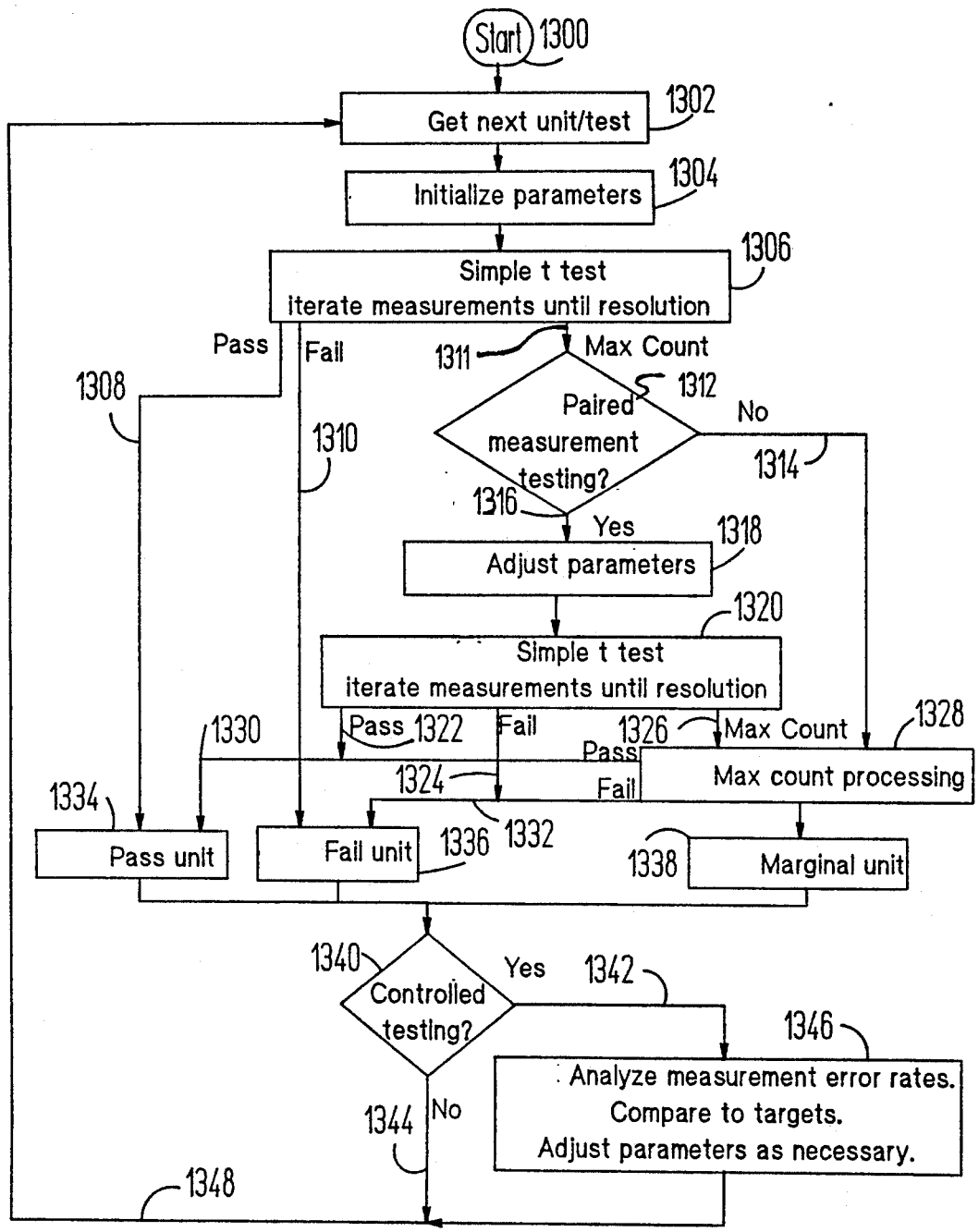
FIG. 13 illustrates steps in a production testing routine which can be used for conducting tests on multiple DUTs. The illustrated routine is an expansion of step 320 in FIG. 3.
Figure 14:
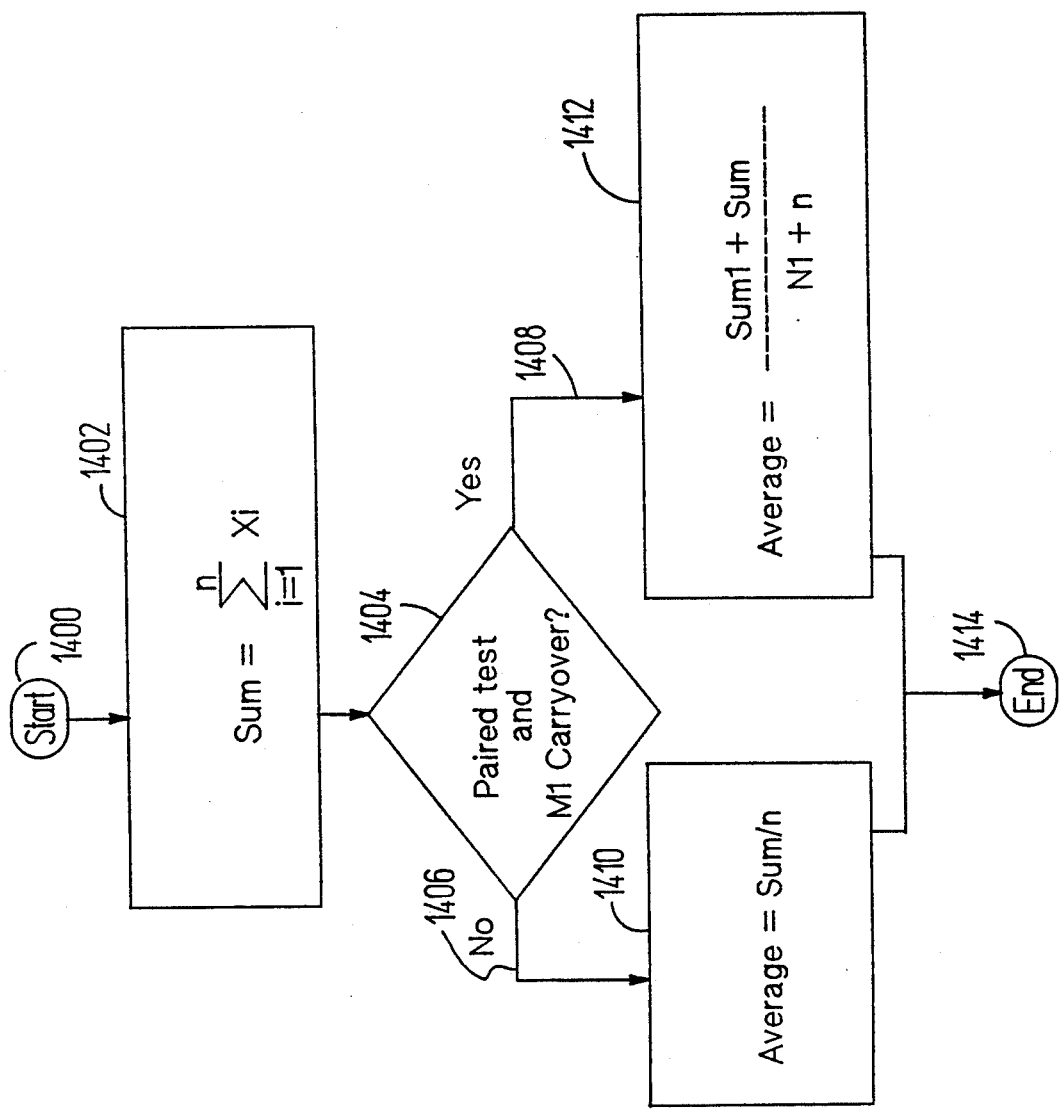
FIG. 14 is an expansion of step 1206 in FIG. 12 illustrating the method for computing the measurement average and adjusting the average in the case of a paired test method.
Figure 15:
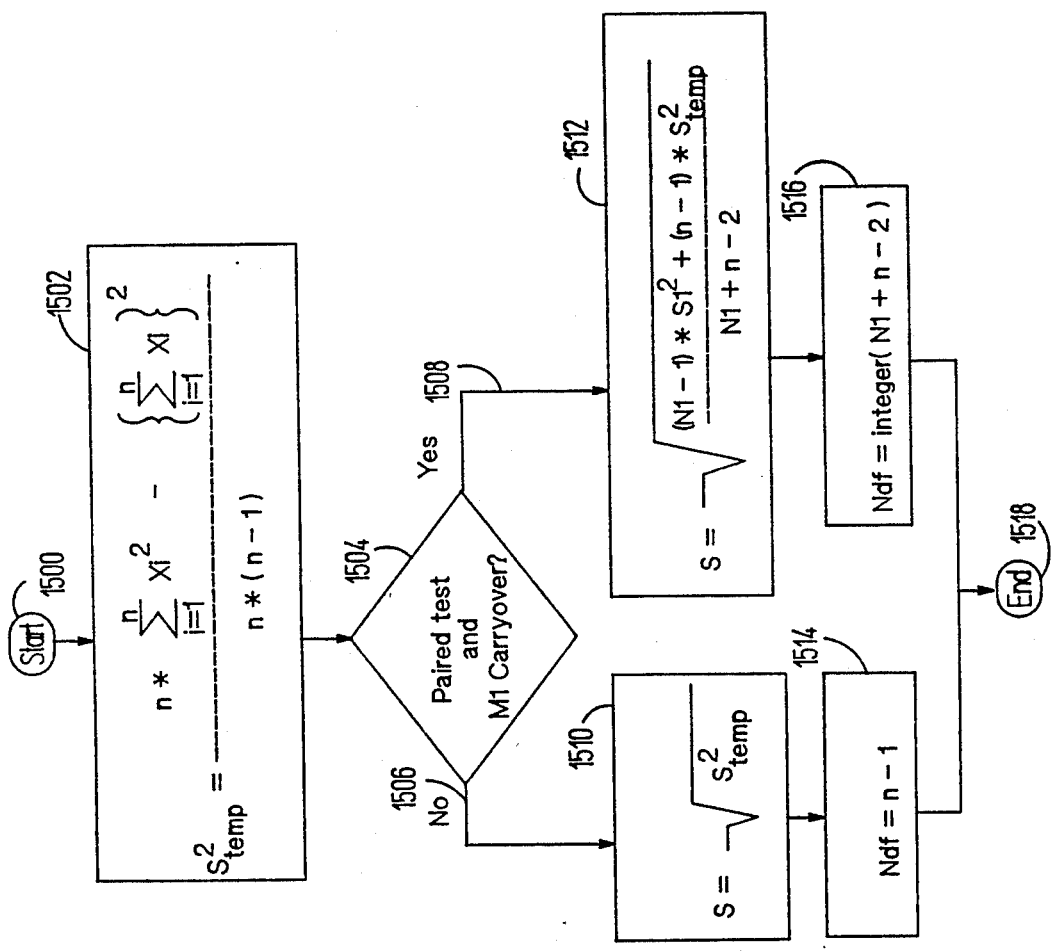
FIG. 15 is an expansion of step 1208 in FIG. 12 illustrating a method for computing an estimate of the standard deviation (S) using standard formulas and adjusting the estimate in the case of a paired test method.

Referring to FIG. 13, a basic set of steps for performing a Student-t test on multiple DUTs in a production environment is shown. The Student-t test routine illustrated in FIG. 13 is similar in overall structure to the routine shown in FIG. 5 with respect to the Z-test, except that the basic Student-t test is substituted in FIG. 13 for the aforementioned Z-test. More particularly, the Student-t test routine begins in step 1300 and proceeds to step 1302.

In step 1302, at the start of the testing sequence the first DUT is obtained and placed in testing position and the testing unit is setup for measuring the first parameter. After the testing routine is started the routine returns to step 1302 either to set up the testing machine to perform a measurement of a new parameter on a DUT which has previously been tested or to place a new DUT into testing position if the previous testing sequence has been completed.

The routine then proceeds to step 1304 in which parameters for the Student t test are initialized. In step 1304, the previously-calculated t-value tables are retrieved and various process variables are initialized. These process variables include a count variable (n) which equals the number of measurements that have been taken for a particular parameter and a sum value (Sum) which is the sum of all of the measurement values. The "n" and "Sum" process variables are used to calculate a running measurement average and in the calculation of the present t-values.

The routine then proceeds to step 1306 in which a simple t-test is performed on the DUT. The t-test is the same test which is used for testing a single DUT as previously described. The steps involved in the illustrative simple iterative t-test are shown in more detail in FIG. 12 and described in detail above.

Referring now back to FIG. 13, the outcome of the simple t-test in step 1306 results in progress along one of paths 1308, 1310 and 1311. In particular, a "PASS" outcome of the simple t-test results in the DUT being passed and the routine proceeds along path 1308 to step 1334, in which the unit is marked, or allocated, as passed. Alternatively, if the t-test routine results in an indication that the DUT has failed, then the routine proceeds, via path 1310, to step 1336, in which the unit is marked as failed.

The third alternative in which the maximum measurement count is reached, results in the routine following path 1311 to step 1312 in which a check is made to determine whether paired measurement testing is in effect. If not, the routine proceeds, via path 1314, directly to step 1328 in which further processing of the unit is conducted as will hereinafter be explained.

Alternatively, if, in step 1312, a determination is made that paired measurement testing is being used, then the routine proceeds, via path 1316, to step 1318, in which selected test parameters are adjusted to account for the M1 testing already completed so that the test sequence can be continued with M2 tests.

Figure 16:
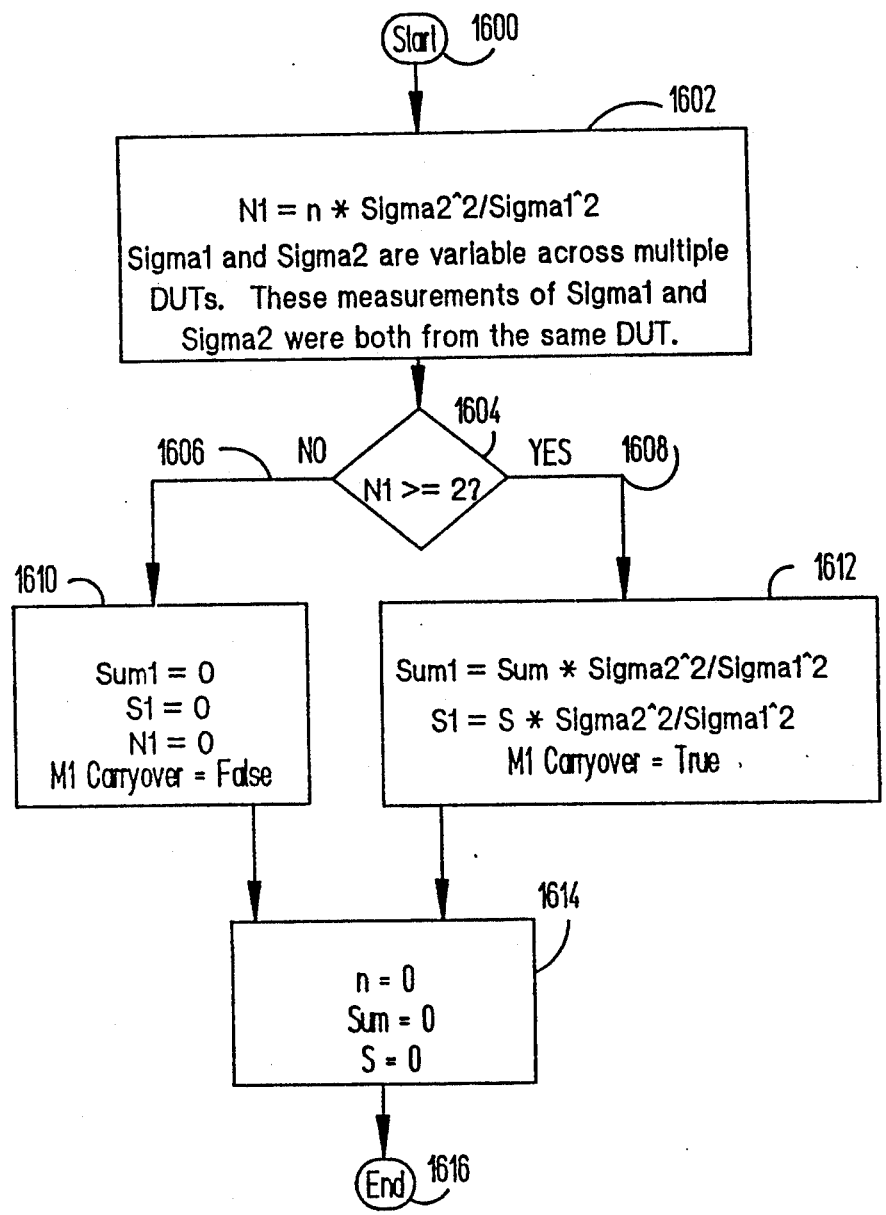
FIG. 16 is an illustrative routine expanding step 1318 of FIG. 13 and illustrates how test parameters are adjusted in the case of a paired test method.

The adjustment of the parameters in step 1318 is shown in more detail in FIG. 16. More particularly, the routine starts in step 1600 and proceeds to step 1602. In step 1602, the M1 carryover variable (N1) is determined by multiplying the current measurement count (n) by the ratio of the variance for M2 test measurements (Sigma2 squared) divided by the variance for M1 test measurements (Sigma1 squared). It should be noted that, since the estimated standard deviations (and, therefore, the variances) are variable across multiple DUTs (this is the assumption that required the use of the t-test in the first place) that both the measurement of Sigma1 and the measurement of Sigma2 must be taken from multiple measurements made on the same DUT.

The routine then proceeds to step 1604 in which a determination is made as to whether the N1 value is greater than or equal to two If not, the results of the previous M1 tests will not significantly affect the M2 test results in which case the M1 test process variables are cleared to zero (including the running sum (Sum1), estimated standard deviation (S1) and the M1 carryover variable (N1)). In addition, an M1 carryover process flag is set equal to false to indicate that there is no carryover adjustment necessary in further test steps.

Alternatively, if, in step 1604, it has been determined that the M1 test results have a significant effect on the M2 test results, the routine proceeds, via path 1608, to step 1612 in which the measurement running sum value (Sum1) is adjusted by multiplying the current measurement sum by the ratio of the yaplance of the M2 test measurements divided by the variance of the M1 test measurements. In a similar manner, the estimated standard deviation for the M1 test measurements is adjusted by multiplying it by the same ratio of the variances. Finally, the M1 carryover flag variable is set equal to "true" to indicate during later processing that adjustments will be necessary on the M2 test results.

In the case of either of steps 1610 and 1612, the routine proceeds to step 1614 in which the current count number, running sum and estimated standard deviation variables (n, Sum, and S) are set equal to zero and the routine ends in step 1612).

Referring back to FIG. 13, after the parameters have been adjusted in step 1318, the simple t-test is then again performed in step 1320 using M2 tests. The t-test (shown in detail in FIG. 13) results in three resolutions (PASS, FAIL, and MAX COUNT reached). If the unit is resolved as PASSED in accordance with the t-test as previously described, the routine proceeds by path 1322 to step 1334 in which the DUT is marked as passed. Alternatively, if step 1320 results in a FAIL resolution, then the routine proceeds, via path 1324, to step 1336 in which the DUT is marked as failed.

A Max Count resolution in step 1320 results in the routine proceeding to step 1328. Max Count processing in accordance with step 1328 is shown in more detail in FIG. 9 and depends on a user-selected implementation of the inventive method as discussed in detail with regard to the latter figure. As illustrated, the Max Count processing step 1328 results in one of three outcomes: PASS, FAIL or MARGINAL.

In any case, referring to FIG. 13, after the DUT has been resolved into one of the three categories in step 1328, the PASS outcome causes the routine to proceed, via path 1330, to step 1334 in which the DUT is marked as passed. The FAIL outcome from step 1328 causes the routine to proceed, via path 1332, to step 1336, in which the DUT is marked as failed. A marginal outcome in step 1328 causes the routine to proceed, via path 1337, to step 1338, in which the DUT is marked as marginal.

After the DUTs have been marked, the routine proceeds to step 1340. In accordance with another aspect of the invention, it is also possible for the test method to "feedback" information obtained during the testing sequence to dynamically modify the test pass/fail t-value limits so that system error rates approach desired error rates associated with the confidence levels originally set by the user.

More particularly, in step 1340, a check is made to determine whether the overall "feedback" is to be applied to dynamically alter the pass/fail test t-value limits. If the answer is no, the routine proceeds, via paths 1344 and 1348 to step 1302, in which the next unit is placed in the test position or the next test is conducted.

Alternatively, if controlled testing is selected, the routine proceeds, via path 1342, to step 1346. In step 1346, the present measurement error rates are analyzed and compared to the desired targets to determine whether the pass/fail limits should be adjusted to bring the calculated error rates into alignment with the desired targets.

Figure 17:
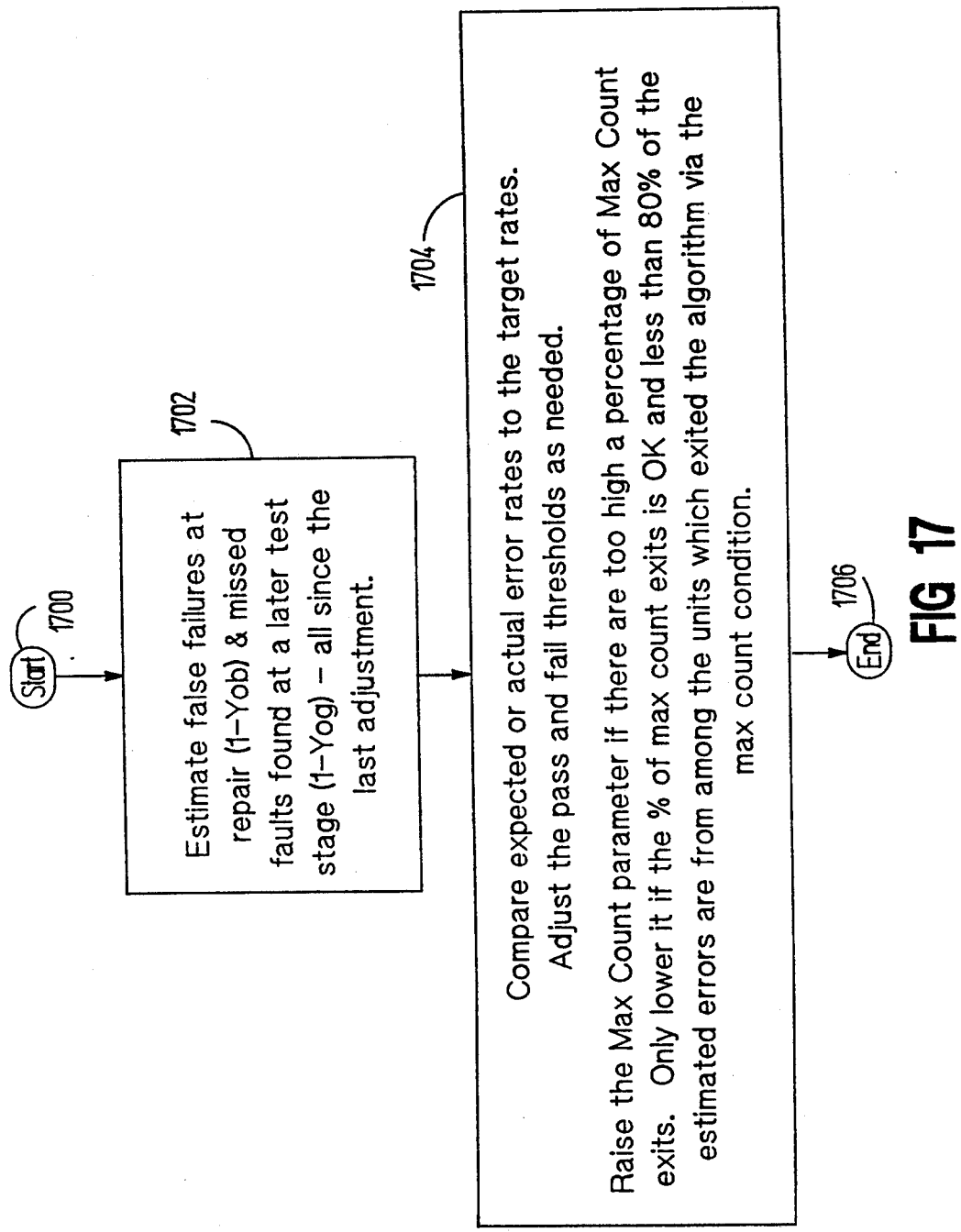
FIG. 17 is an expansion of step 1346 in FIG. 13 in which measurement error rates are analyzed, compared to target values received from the user and test parameters are adjusted as necessary to cause the measurement error rates to approach the target values.

An illustrative routine for analyzing measurement error rates and comparing them to desired targets is shown in more detail in FIG. 17. In particular, the illustrated routine is similar to that used in connection with the Z-statistics routine shown in FIG. 10. The routine starts in step 1700 and proceeds to step 1702. In step 1702, the output error rates are estimated. These consist of the false failures at repair, which, as previously mentioned can be obtained either by estimation, or by analyzing actual data obtained at the repair station. The false failure estimate is obtained for units since the last pass/fail limit adjustment has been made in accordance with the invention.

In addition, the second error rate, which is the missed faults found at a later test stage, can also be estimated or calculated. Again, this number can be predicted or obtained from actual data and is obtained for DUT tested since the last adjustment in accordance with the inventive feedback mechanism.

The routine then proceeds to step 1704, in which estimated or actual error rates are compared to target rates. The target rates are, in turn, determined by the confidence level targets initially set by the user in step 114 (FIG. 1). For example, a confidence level of 0.999 corresponds to an error rate of 0.001. In order to properly adjust the system, if the estimated or actual error rate exceeds the corresponding target rate, then the corresponding pass/fail Student-t limit tables (originally calculated in step 206) are rebuilt in order to cause the estimated or actual rates to approach the desired target rates as set forth in step 1704. In addition, the Max Count number may also be adjusted as indicated in step 1704. More particularly, if there are a large number of Max Count exits, the Max Count variable value is raised. The Max Count variable is only lowered if the percentage of maximum count exits is reasonable and less than 80% of the estimated errors come from among DUTs that exited the testing routine via the Max Count condition. After adjustments to the pass/fail limits have been made, the routine ends at step 1706.

Referring back to FIG. 13, after step 1346 has been completed and the test limits adjusted as necessary, the routine proceeds, via path 1348, to step 1302, in which the next unit or test is prepared. Steps 1302-1246 are then repeated until all tests have been completed.

Although only a single embodiment of the inventive method have been described, several modifications and changes will be immediately apparent to those skilled in the art. For example, instead of applying the null hypothesis test after each measurement, a "test value" can be obtained by averaging a plurality of measurements. The null hypothesis test can then be applied using the test values in place of actual measurement values. These modifications and other obvious changes are intended to be covered by the following claims.

What is claimed is:

1. A method for pass/fail testing an electronic assembly with a desired confidence target level by measuring a parameter in the presence of noise with known noise characteristics and comparing said measurement with a predetermined limit, said method comprising the steps of:
   A. calculating at least one statistical limit value from said confidence target level;
   B. obtaining a test value which represents a measured value of said parameter;
   C. calculating an average measurement value from all test values of said parameter including the test value obtained in step B;
   D. calculating a statistical value from said predetermined limit, said average measurement value calculated in step C and said noise characteristics;
   E. repeating steps B through D when said statistical value calculated in step D has a predetermined relationship to said statistical limit value calculated in step A;
   F. resolving the pass/fail status of said assembly by comparing said average measurement value to said predetermined limit when said statistical value calculated in step D has a relationship other than said predetermined relationship to said statistical limit value calculated in step A.

2. A method for pass/fail testing an electronic assembly according to claim 1 wherein step B comprises the step of:
   B1. obtaining a test value by performing a single measurement of said parameter.

3. A method for pass/fail testing an electronic assembly according to claim 1 wherein step B comprises the steps of:
   B2. obtaining a test value by performing a plurality of measurements of said parameter and mathematically combining said plurality of measurements.

4. A method for pass/fail testing an electronic assembly according to claim 1 wherein step A comprises the step of:
   A2. calculating a statistical Z-value limit from said confidence target level by determining the number of standard deviations necessary to achieve said confidence target level from said normalized distribution curve.

5. A method for pass/fail testing an electronic assembly according to claim 1 further comprising the steps of:
   G. calculating output error rates for said assembly;

H. comparing calculated error rates against predetermined error rate targets; and
I. adjusting said statistical limit value to cause said calculated error rates to approach said predetermined error rate targets.

6. A method for pass/fail testing an electronic assembly according to claim 1 wherein step A comprises the steps of:
   A1. counting the number of measurements taken; and
   A2. calculating a statistical Student-t value limit from said confidence target level and the number of measurements counted in step A1.

7. A method for pass/fail testing an electronic assembly according to claim 1 wherein step D comprises the step of:
   D1. calculating a statistical Student-t value from said from said predetermined limit, said average measurement value calculated in step C and an estimate of the standard deviation of said noise.

8. A method for pass/fail testing an electronic assembly according to claim 1 wherein step D comprises the step of:
   D1. calculating a statistical Z-value from said from said predetermined limit, said average measurement value calculated in step C and an estimate of the standard deviation of said noise.

9. A method for pass/fail testing an electronic assembly according to claim 8 wherein step D1 comprises the step of:
   D1A. calculating a statistical Z-value from said from said predetermined limit, said average measurement value calculated in step C and an estimate of the standard deviation of said noise according to the formula:

$$Z = \frac{ABS(\text{Average} - \text{Limit})}{S/SQR(\text{Number of Measurements})}$$

where ABS is an absolute value operator, S is the estimated standard deviation and SQR is a square root operator.

10. A method for pass/fail testing an electronic assembly according to claim 8 wherein step D1 comprises the step of:
    D1A. calculating a statistical Student-t value from said from said predetermined limit, said average measurement value calculated in step C and an estimate of the standard deviation of said noise according to the formula:

$$t = \frac{ABS(\text{Average} - \text{Limit})}{S/SQR(\text{Number of Measurements})}$$

where ABS is an absolute value operator, S is the estimated standard deviation and SQR is a square root operator.

11. A method for testing an electronic assembly by measuring a parameter in the presence of noise with known noise characteristics, said method comprising the steps of:
    A. establishing an acceptable range of values for said parameter;
    B. establishing a desired confidence target for passing said assembly and a desired confidence target for failing said assembly;
    C. calculating a first statistical limit value from said confidence target for passing said assembly and calculating a second statistical limit value from said confidence target for failing said assembly;
    D. estimating the standard deviation of said noise;
    E. measuring a value of said parameter;
    F. calculating an average measurement value from all measured values of said parameter including the value measured in step E;
    G. calculating a first statistical value and a second statistical value from said acceptable range of values established in step A, said average measurement value calculated in step F and said estimated standard deviation from step D;
    H. comparing said first and said second statistical values calculated in step G to said first and said second statistical limit values calculated in step C;
    I. repeating steps E through H when said first statistical value or said second statistical value calculated in step G is less than said first statistical limit value calculated in step C and said both first statistical value and said second statistical value are greater than said second statistical limit value calculated in step C;
    J. passing said assembly when said first statistical value and said second statistical value calculated in step G are greater than said first statistical limit value calculated in step C; and
    K. failing said assembly when said first statistical value or said second statistical value calculated in step G are less than said second statistical limit value calculated in step C.

12. A method for pass/fail testing an electronic assembly according to claim 11 wherein step C comprises the steps of:
    C1. obtaining a normalized distribution curve; and
    C2. calculating a first statistical Z-value limit from said confidence target for passing said assembly by determining the number of standard deviations necessary to achieve said confidence target level from said normalized distribution curve; and
    C3. calculating a second statistical Z-value limit from said confidence target for failing said assembly by determining the number of standard deviations necessary to achieve said confidence target level from said normalized distribution curve.

13. A method for pass/fail testing an electronic assembly according to claim 11 wherein step G comprises the step of:
    G1. calculating a first statistical Z-value from an upper limit of said acceptable range of values, said average measurement value calculated in step F and an estimate of the standard deviation of said noise according to the formula:

$$Z = \frac{\text{Upper Limit} - \text{Average}}{S/SQR(\text{Number of Measurements})}$$

where S is the estimated standard deviation and SQR is a square root operator.

14. A method for pass/fail testing an electronic assembly according to claim 11 wherein step G comprises the step of:
    G2. calculating a second statistical Z-value from a lower limit of said acceptable range of values, said average measurement value calculated in step F and an estimate of the standard deviation of said noise according to the formula:

$$Z = \frac{\text{Average} - \text{Lower Limit}}{S/SQR(\text{Number of Measurements})}$$

where S is the estimated standard deviation and SQR is a square root operator.

15. A method for pass/fail testing an electronic assembly according to claim 11 further comprising the steps of:
   L. calculating output error rates for said assembly;
   M. comparing calculated error rates against predetermined error rate targets; and
   N. adjusting said first and said second statistical limit values to cause said calculated error rates to approach said predetermined error rate targets.

16. A method for pass/fail testing an electronic assembly according to claim 11 wherein step D comprises the steps of:
   D1. repeatedly measuring a single electronic assembly to obtain a plurality of measurements; and
   D2. calculating an estimate of the standard deviation of from said plurality of measurements obtained in step D1.

17. A method for pass/fail testing an electronic assembly according to claim 11 wherein step I comprises the steps of:
   I1. establishing a predetermined maximum number of measurements;
   I2. repeating steps E through H when said first statistical value or said second statistical value calculated in step G is less than said first statistical limit value calculated in step C and said both first statistical value and said second statistical value are greater than said second statistical limit value calculated in step C and the number of measurements is less than or equal to the maximum number of measurements established in step I1; and
   I3. discontinuing testing when the number of measurements is greater than the maximum number of measurements established in step I1.

18. A method for pass/fail testing an electronic assembly according to claim 17 wherein step I3 comprises the step of:
   I3A. designating said electronic assembly as passed when the number of measurements is greater than the maximum number of measurements established in step I1.

19. A method for pass/fail testing an electronic assembly according to claim 17 wherein step I3 comprises the step of:
   I3A. designating said electronic assembly as failed when the number of measurements is greater than the maximum number of measurements established in step I1.

20. A method for pass/fail testing an electronic assembly according to claim 17 wherein step I3 comprises the steps of:
   I3A. designating said electronic assembly as marginal when the number of measurements is greater than the maximum number of measurements established in step I1.

21. A method for pass/fail testing an electronic assembly with a desired confidence target level by measuring a parameter in the presence of noise with known noise characteristics and comparing said measurement with a predetermined limit, said method comprising the steps of:
   A. calculating a statistical limit value from said confidence target level;
   B. selecting a measurement technique from a first measurement technique and a second measurement technique;
   C. measuring a value of said parameter by means of a measurement technique selected in step B;
   D. calculating an average measurement value from all measured values of said parameter including the value measured in step B;
   E. calculating a statistical value from said predetermined limit, said average measurement value calculated in step C and said noise characteristics;
   F. repeating steps B through E when said statistical value calculated in step E is less than said statistical limit value calculated in step A; and
   G. resolving the pass/fail status of said assembly by comparing said average measurement value to said predetermined limit when said statistical value calculated in step E is greater than or equal to said statistical limit value calculated in step A.

22. A method for pass/fail testing an electronic assembly according to claim 21 wherein step B comprises the steps of:
   B1. determining the cost of said first measurement technique and the cost of said second measurement technique;
   B2. determining the measurement value variance of said first measurement technique and said second measurement technique;
   B3. forming the product of the cost and the variance of said first measurement technique;
   B4. forming the product of the cost and the variance of said second measurement technique; and
   B5. comparing the product formed in step B3 to the product formed in step B4.

23. A method for pass/fail testing an electronic assembly according to claim 22 wherein step B further comprises the steps of:
   B6. selecting said first measurement technique for a predetermined number of tests; and
   B7. selecting said second measurement technique for all tests beyond said predetermined number of tests.

24. A method for pass/fail testing an electronic assembly according to claim 23 wherein step B further comprises the step of:
   B8. adjusting said average measurement value calculated in step D when said second measurement technique is selected.

25. A method for pass/fail testing electronic assemblies with a desired confidence target level by making repeated measurements of at least one test parameter in the presence of noise and comparing said measurements with at least one predetermined pass/fail limit, said method comprising the steps of:
   A. selecting a measurement method for measuring said test parameter which produces a set of measurement values in which the mean value of said set of measurement values approximates a true value of said test parameter;
   B. obtaining a set of measurements by making repeated measurements of said test parameter on at least two electronic assemblies;
   C. calculating an estimated standard deviation from said set of measurements obtained in step B;

D. selecting a statistical test method based on predetermined characteristics of said estimated standard deviation calculated in step C;

E. calculating at least one statistical limit value appropriate to the statistical test method selected in step D by using said confidence target level;

F. making at least one measurement of a value of said test parameter on a selected electronic assembly using the measurement method selected in step A;

G. calculating a weighted average measurement value from all measurements of said test parameter including the test value obtained in step F;

H. calculating a statistical value from said predetermined limit and said weighted average measurement value calculated in step G;

I. repeating steps F through H when said statistical value calculated in step H has a predetermined relationship to said statistical limit value calculated in step E; and J. resolving the pass/fail status of said electronic assembly by comparing said average measurement value to said predetermined limit when said statistical value calculated in step H has a relationship other than said predetermined relationship to said statistical limit value calculated in step E.

26. A method for pass/fail testing electronic assemblies according to claim 25 wherein step A further comprises the step of:

A1. selecting a measurement method for measuring said test parameter which produces a set of measurement values in which the standard deviation of said set of measurement values is substantially constant.

27. A method for pass/fail testing electronic assemblies according to claim 25 wherein step A further comprises the step of:

A2. selecting a first measurement method for measuring said test parameter;

wherein step I comprises the step of:

I1. repeating steps F through H using said first measurement method selected in step A2 when said statistical value calculated in step H has a predetermined relationship to said statistical limit value calculated in step E for a predetermined number of repetitions;

wherein step A further comprises the step of:

A3. selecting a second measurement method for measuring said test parameter after said predetermined number of repetitions has been reached in step I1; and wherein step I further comprises the step of:

I2. repeating steps F through H using said second measurement method selected in step A3 when said statistical value calculated in step H has a predetermined relationship to said statistical limit value calculated in step E.

C3. calculating a noise distribution from each set of measurements obtained in step B1 when said standard deviations are not substantially constant from electronic assembly to electronic assembly.

28. A method for pass/fail testing electronic assemblies according to claim 25 wherein step D comprises the steps of:

D1. selecting a Z-statistical test method when said estimated standard deviation calculated in step C is substantially constant from electronic assembly to electronic assembly; and D2. selecting a Student-t statistical test method when said estimated standard deviation calculated in step C is not substantially constant from electronic assembly to electronic assembly.

29. A method for pass/fail testing electronic assemblies according to claim 25 wherein step E comprises the steps of:

E1. calculating at least one Z-statistical limit value from said confidence target level when a Z-statistical test method is selected in step D; and E2. calculating a plurality of Student-t statistical limit values from said confidence target level when a Student-t statistical test method is selected in step D.

30. A method for pass/fail testing electronic assemblies according to claim 25 wherein step F comprises the step of:

F1. making a single measurement of said one value of said test parameter.

31. A method for pass/fail testing electronic assemblies according to claim 25 wherein step F comprises the step of:

F2. making two measurements of said one value of said test parameter and averaging the results of said two measurements to generate a measurement value.

32. A method for pass/fail testing electronic assemblies according to claim 25 wherein step G comprises the step of:

G3. adding the values of all measurements taken in step F to generate a measurement sum and dividing said measurement sum by a number of measurements taken in step F.

33. A method for pass/fail testing electronic assemblies according to claim 25 wherein step H comprises the steps of:

H1. calculating a statistical value from said predetermined limit and said weighted average measurement value calculated in step G and a pre-computed value for the standard deviation of the measurement noise when the statistical test method chosen in step D is the Z-statistical test; and H2. calculating a statistical value from said predetermined limit and said weighted average measurement value calculated in step G and a value for the standard deviation of the measurement noise computed from measurement values obtained in step F when the statistical test method chosen in step D is the Student-t statistical test.

34. A method for pass/fail testing electronic assemblies according to claim 25 wherein step J comprises the step of:

J1. assigning an electronic assembly under test to a marginal category when the pass or fail status cannot be resolved.

35. A method for pass/fail testing electronic assemblies according to claim 25 wherein step B comprises the steps of:

B1. obtaining a set of measurements by making repeated measurements of said test parameter on a first electronic assembly; and B2. replacing said first electronic assembly with a second electronic assembly different from said first electronic assembly; and B3. repeating steps B1 and B2 a predetermined number of times.

36. A method for pass/fail testing electronic assemblies according to claim 35 wherein step C comprises the steps of:
- C1. calculating an estimated standard deviation from each set of measurements obtained in step B1;
- C2. comparing the estimated standard deviations calculated in step C1 to determine whether said standard deviations are substantially constant from electronic assembly to electronic assembly; and
- C3. calculating a noise distribution from each set of measurements obtained in step B1 when said standard deviations are not substantially constant from electronic assembly to electronic assembly.

37. A method for pass/fail testing electronic assemblies according to claim 25 wherein step F comprises the step of:
- F3. making a predetermined number of measurements of said one value of said test parameter and averaging the results of said two measurements to generate a measurement value.

38. A method for pass/fail testing electronic assemblies according to claim 37 wherein step G comprises the steps of:
- G1. weighting each measurement value determined in step F3 by said predetermined number of measurements; and
- G2. adding the values of all weighted measurements determined in step G1 to generate a measurement sum and dividing said measurement sum by a number of measurements taken in step F.

* * * * *